United States Patent
Shiota et al.

(10) Patent No.: US 7,169,513 B2
(45) Date of Patent: Jan. 30, 2007

(54) HALFTONE TYPE PHASE SHIFT MASK BLANK AND PHASE SHIFT MASK THEREOF

(75) Inventors: Yuuki Shiota, Tokyo (JP); Osamu Nozawa, Tokyo (JP); Hideaki Mitsui, Tokyo (JP)

(73) Assignee: Hoya Corporation, Tokyo ( * ) Notice: Subject to any disclaimer, the term of this patent is extended or adjusted under 35 U.S.C. 154(b) by 76 days.

(21) Appl. No.: 10/370,713

(22) Filed: Feb. 24, 2003

(65) Prior Publication Data

US 2003/0180630 A1   Sep. 25, 2003

(30) Foreign Application Priority Data

Feb. 22, 2002  (JP)  ................ P.2002-047050
Apr. 25, 2002  (JP)  ................ P.2002-124769
Nov. 8, 2002   (JP)  ................ P.2002-325200

(51) Int. Cl.
*G03F 1/00* (2006.01)

(52) U.S. Cl. ........................................... 430/5
(58) Field of Classification Search .......... 430/5; 382/144
See application file for complete search history.

(56) References Cited

U.S. PATENT DOCUMENTS 5,362,591 A * 11/1994 Imai et al. ................... 430/5
5,409,789 A *  4/1995 Ito ............................... 430/5
5,935,735 A *  8/1999 Okubo et al. ................ 430/5

FOREIGN PATENT DOCUMENTS

JP       7-168343      7/1995
JP       2001-174973   6/2001

* cited by examiner

*Primary Examiner*—S. Rosasco
(74) *Attorney, Agent, or Firm*—Sughrue Mion, PLLC

(57) ABSTRACT

A halftone type phase shift mask blank including, on a transparent substrate, at least a phase shifter film having a predetermined transmittance for an exposed light and a predetermined phase difference for the transparent substrate, wherein the phase shifter film is formed by a multilayer film in which films including at least two layers having an upper layer formed on the most surface side and a lower layer formed thereunder are provided, and a thickness of the upper layer is adjusted in such a manner that a refractive index of the film to be the upper layer is smaller than that of the film to be the lower layer and a surface reflectance for the inspecting light of the phase shifter film is maximized and approximates to a maximum.

56 Claims, 17 Drawing Sheets

FIG. 8

| | EMBODIMENT 1 | COMPARATIVE EXAMPLE 1 | COMPARATIVE EXAMPLE 2 | EMBODIMENT 2 | EMBODIMENT 3 |
|---|---|---|---|---|---|
| EXPOSURE WAVELENGTH | 193 nm | 193 nm | 193 nm | 157 nm | 157 nm |
| INSPECTION WAVELENGTH | 364 nm | 364 nm | 364 nm | 257 nm | 257 nm |
| MATERIAL OF LOWER LAYER / THICKNESS OF LOWER LAYER | Ta, 80A | Ta, 100A | TaN, 60A | TaN, 80A | Zr, 60A |
| MATERIAL OF UPPER LAYER / THICKNESS OF UPPER LAYER | SiON, 950A | SiON, 1500A | SiN, 550A | SiON, 750A | SiON, 770A |
| GAS CONDITION OF UPPER LAYER Ar : N2 : O2 (%) | 40:59.3:0.7 | 40:58 :2 | 40:60 :0 | 40:59 :1 | 40:59.3:0.7 |
| REFRACTIVE INDEX OF UPPER LAYER n (EXPOSED LIGHT) | 2.05 | 1.67 | 2.66 | 2.00 | 2.05 |
| REFRACTIVE INDEX OF LOWER LAYER (EXPOSED LIGHT) | 1.74 | 1.74 | 2.29 | UNMEASURED | UNMEASURED |
| REFRACTIVE INDEX OF LOWER LAYER n' (INSPECTING LIGHT) | 1.76 | 1.55 | 2.15 | 1.79 | 1.80 |
| REFRACTIVE INDEX OF LOWER LAYER (INSPECTING LIGHT) | 2.31 | 2.31 | 3.42 | 2.75 | 1.84 |
| TRANSMITTANCE OF EXPOSED LIGHT | 14% | 16% | 10% | 9.5% | 7.5% |
| TRANSMITTANCE OF INSPECTING LIGHT | 30% | 42% | 59% | 37% | 45% |
| REFLECTANCE OF INSPECTING LIGHT | 30% | 2% | 6% | 24% | 16% |
| EXECUTION OF APPEARANCE INSPECTION | ◯ | ✕ | ✕ | ◯ | ◯ |

FIG. 15

| EMBODI-MENTS | FILM THICKNESS | | Ta-Hf COMPOSITION (atm%) | | SiOxNy FILM COMPOSITION (atm%) | | |
|---|---|---|---|---|---|---|---|
| | Ta-Hf (Å) | SiON (Å) | Ta | Hf | Si | O | N |
| NO. 6 | 65 | 840 | | | 38 | 35 | 27 |
| NO. 7 | 70 | 780 | | | 37 | 45 | 19 |
| NO. 8 | 86 | 800 | 90 | 10 | 36 | 47 | 17 |
| NO. 9 | 76 | 801 | 90 | 10 | 36 | 48 | 16 |
| NO. 10 | 76 | 865 | 90 | 10 | 35 | 53 | 12 |
| NO. 11 | 65 | 905 | 90 | 10 | 35 | 56 | 10 |
| NO. 12 | 58 | 818 | 80 | 20 | 40 | 28 | 32 |
| NO. 13 | 90 | 720 | 90 | 10 | 37 | 43 | 20 |
| NO. 14 | 100 | 1000 | 80 | 20 | 34 | 62 | 4 |
| COMPARISON EXAMPLE 1 | 68 | 720 | | | 37 | 43 | 20 |

FIG. 16

| EMBODI-MENTS | TRANSMITTANCE AT EXPOSURE WAVELENGTH | | OPTICAL CHARACTERISTICS AT INSPECTION WAVELENGTH | | | INSPECTION | |
|---|---|---|---|---|---|---|---|
| | %T @ 157 nm | %T @ 193 nm | %T @ 364 nm | %R @ 364 nm | %R @ 488 nm | PRESENCE OF BLANKS FOREIGN SUBSTANCE AND DEFECT | EXECUTION OF MASK SHAPE INSPECTION |
| NO. 6 | | 15 | 35.6 | 23.6 | 6.9 | ○ | ○ |
| NO. 7 | 6 | | 37.3 | 15.7 | 1.8 | ○ | ○ |
| NO. 8 | 6 | | 30.0 | 22.0 | 4.3 | ○ | ○ |
| NO. 9 | 11 | | 34.7 | 17.1 | 2.4 | ○ | ○ |
| NO. 10 | 15 | | 33.4 | 19.0 | 3.6 | ○ | ○ |
| NO. 11 | 20 | | 37.3 | 17.6 | 3.1 | ○ | ○ |
| NO. 12 | | 19 | 36.6 | 23.2 | 6.5 | ○ | ○ |
| NO. 13 | 5 | | 32.1 | 18.1 | 2.5 | ○ | ○ |
| NO. 14 | | 14 | 32.2 | 35.1 | 20.2 | × | × |
| COMPARISON EXAMPLE 1 | 6 | | 39.7 | 12.64 | 1.01 | ○ | ○ |

NO. 14

COMPARATIVE EXAMPLE

HALFTONE TYPE PHASE SHIFT MASK BLANK AND PHASE SHIFT MASK THEREOF

BACKGROUND OF THE INVENTION

1. Field of the Invention

The present invention relates to a phase shift mask capable of enhancing the resolution of a transfer pattern by utilizing the interference action of a light by a phase shifter and a phase shift mask blank to be a material thereof, and more particularly to a halftone type phase shift mask and mask blank.

2. Description of the Related Art

As one of the examples of a super-resolution technique of photolithography in recent years, there raised a phase shift mask. In particular, since a halftone type phase shift mask can be subjected to a pattern processing comparatively easily during the fabrication of the mask, it has widely been used mainly for the formation of a contact hole. Furthermore, there has recently been progressed an application to a cyclic pattern and an isolated pattern such as a line and space (L & S) in a DRAM.

As shown in FIG. 27, the halftone type phase shift mask comprises, on a transparent substrate 2, at least a light transmitting section 7 and a halftone phase shifter section 5 having a light semi-transmitting property and a phase shift function and can be roughly divided into a monolayer type and a multilayer type in respect of the structure of the halftone phase shifter section 5. The monolayer type is currently a mainstream because of the easiness of a workability and the halftone phase shifter section is constituted by a monolayer film comprising MoSiN or MoSiON in most cases. On the other hand, in the multilayer type, the halftone phase shifter section is constituted by a combination of a layer for mainly controlling a transmittance and a layer for mainly controlling a phase shift amount, and it is possible to independently control a spectral characteristic represented by the transmittance and the phase shift amount (phase angle).

On the other hand, it can be expected that the wavelength of an exposure light source (the wavelength of an exposed light) will be reduced from an existing KrF excimer laser (248 nm) to an ArF excimer laser (193 nm), and furthermore, to an $F_2$ excimer laser (157 nm) with the microfabrication of an LSI pattern in the future. With such a reduction in the wavelength of the exposure light source, the range of choice of the material of the halftone phase shifter section to satisfy a predetermined transmittance and phase shift amount tends to be reduced. With the reduction in the wavelength of the exposure light source, moreover, a material having a high light transmitting property is required at a conventional wavelength. As a result, there is a problem in that an etching selectivity with a quartz substrate is reduced in patterning. A multilayer type (two-layer film) halftone phase shifter has advantages that a phase difference and a transmittance can be controlled by a combination of the two-layer films and a material can easily be selected and that such a material as to play a part in the etching stopper of an upper layer can be selected as a lower layer (JP-A-2001-174973). Therefore, the multilayer type (two-layer type) halftone phase shifter has been developed.

At the step of inspecting the pattern appearance of a mask which is fabricated, generally, an optical inspection is carried out. In general, the wavelength of an inspecting light is different from that of an exposed light and a light having a longer wavelength than the wavelength of the exposed light is usually selected as the wavelength of the inspecting light. More specifically, a light in the vicinity of a wavelength which is longer than the wavelength of the exposed light by one generation or more (a light in the vicinity of the conventional wavelength of the exposed light) is often used as the wavelength of the inspecting light. The reason is that the guarantee of precision in the inspection of the pattern appearance is stricter than the guarantee of precision in the transmittance of the exposed light. For a pattern appearance inspecting apparatus, a transmission type defect inspecting apparatus is used (for example, KLA300 series).

In order to obtain sufficient precision in a pattern appearance inspection in the phase shift mask, it is necessary to take a transmission contrast of the patterned halftone phase shifter section and the light transmitting section. For this reason, it is necessary to reduce the transmittance of the inspecting light in the halftone phase shifter section. More specifically, the film of the halftone phase shifter section is designed such that the light transmittance of an i ray having a wavelength of 364 nm to be the inspecting light is approximately 40% or less in the pattern appearance inspection utilizing the transmitted light of a KrF (a wavelength of 248 nm) compatible halftone type phase shift mask.

A technique for reducing a transmittance for the wavelength of an inspecting light has been described in JP-A-7-168343 gazette. This gazette has disclosed that a phase shifter section has a two-layer structure including a monolayer film (a phase adjusting layer) such as MoSiO or MoSiON which is known as a monolayer type halftone phase shifter and a transmitting film (a transmittance adjusting layer) having the small wavelength dependency of a transmittance in a combination with the monolayer film and a desirable transmittance can be thus obtained for both an exposed light (KrF excimer laser) and an inspecting light (488 nm).

With the progress of a reduction in the wavelength of the exposed light source described above, however, a halftone phase shifter having a higher light transmitting property than that at a conventional wavelength is required. Therefore, there is a problem in that a light transmittance for the wavelength of the inspecting light is increased. In such a material having a high light transmitting property, particularly, the rate of an increase in a transmittance for a change in a wavelength toward the long wavelength side tends to be increased. Consequently, it is much harder to reduce the light transmittance for the wavelength of the inspecting light down to a predetermined range.

More specifically, for example, it is necessary to further increase the transmittance of a phase difference adjusting layer at a conventional wavelength to cope with a reduction in the wavelength of the exposed light source down to an ArF excimer laser (193 nm), and furthermore, an $F_2$ excimer laser (157 nm) in a mask having a two-layer type half tone phase shifter section comprising the phase difference adjusting layer and the transmittance adjusting layer. In the case in which the transmittance of the phase difference adjusting layer is thus increased, the transmittance for the inspecting light cannot be sufficiently reduced by the transmittance adjusting layer if priority is given to the maintenance (control) of the transmittance for the exposed light. If the thickness of the transmittance adjusting layer is increased to reduce the transmittance for the inspecting light, the transmittance for the exposed light cannot be ensured. In other words, there is a problem in that it is hard to adjust both the maintenance of the transmittance for the exposed light and the reduction in the transmittance for the inspecting light with the thickness of the transmittance adjusting layer.

On the other hand, for the mainstream of an existing halftone type phase shift mask, a film is designed in such a manner that the transmittance of the exposed light in the halftone phase shifter section approximates to 6%. A high transmittance has been required for a further increase in a resolution, and it is said that a transmittance of 15% or more will be required in the future. Also in that case, there is a problem in that the light transmittance of the halftone phase shifter section for the inspecting light is more than 40% and sufficient precision in an inspection cannot be obtained in the inspection of the appearance of a pattern utilizing a transmitted light in the same manner as in the above-mentioned case.

Furthermore, as for a photomask, a reflecting optical system has conventionally been used in a defect inspection. In addition, recently, the reflecting optical system as well as a conventional transmitting optical system have been utilized in the inspection of the pattern appearance of the mask. For this reason, a reflecting contrast of a light semi-transmitting section and a substrate at the wavelength of the light source of an apparatus has been required for obtaining a sufficient inspection sensitivity.

Furthermore, in the case in which a halftone type phase shift mask of a so-called tritone type having a light transmitting section, a light semi-transmitting section and a shielding section provided on the light semi-transmitting section is to be inspected, a reflecting contrast is required for each of the light transmitting section/the light semi-transmitting section, the light semi-transmitting section/the shielding section, and the light transmitting section/the shielding section. More specifically, R1<R2<R3 is required, wherein light reflectances at the wavelengths of light sources in the light transmitting section, the light semi-transmitting section and the shielding section are represented by R1, R2 and R3, respectively.

In order to detect a small defect having a size of 0.1 μm or less and a finer pattern, a wavelength has been reduced from an i-ray (365 nm) to the vicinity of 200 to 300 nm to be a DUV (deep ultraviolet) region in the light source of an inspecting apparatus. The present time is in a transition period. Therefore, it is desirable that a mask and a mask blank should have an optical characteristic corresponding to both inspecting apparatuses of an i-ray light source and a DUV light source. For the DUV light source, 266 nm and 257 nm are being investigated.

In a two-layer halftone type phase shift mask comprising a transmittance adjusting layer and a phase adjusting layer, a light reflectance fluctuates greatly within a range including the wavelength described above. For this reason, there is a problem in that a sufficient reflecting characteristic cannot be obtained at an inspection wavelength (a DUV wavelength) even if it can be obtained at another inspection wavelength (for example, an i-ray wavelength). Consequently, the design of a halftone film is to be changed corresponding to the wavelength of the light source of the inspecting apparatus, which imposes a great burden on development.

Moreover, it is a matter of course that a transmittance and a phase shift amount are adjusted to have desirable values for an exposed light having a short wavelength such as an ArF excimer laser (193 nm) or an $F_2$ excimer laser (157 nm), and it is preferable that a reflectance at the wavelength of the exposed light should also be somewhat low.

For an item required for a photomask in the next generation, the wavelength of an exposed light is to be reduced in respect of an optical characteristic, and furthermore, quality is to be enhanced, that is, defects and foreign substances are to be lessened. For this purpose, it is essential that a system for inspecting a photomask and a photomask blank should be maintained.

In the defect and foreign substance inspection for the photomask and the photomask blank, an optical type inspecting apparatus is mainly used. In general, the light source of the inspecting apparatus uses a light having a longer wavelength than that of the wavelength of an exposed light. Examples of a defect inspecting apparatus for the photomask blank include a mask blank defect inspecting apparatus M-1320 manufactured by Laser Tech Co., Ltd., and the light source of an inspecting apparatus represented by the same apparatus mainly has a wavelength of 488 nm. In order to maintain precision in the defect and foreign substance inspection for the photomask and the photomask blank, accordingly, it is necessary to set a transmittance and a reflectance for an inspecting light within a certain range.

In a two-layer type halftone phase shift mask blank comprising a transmittance adjusting layer and a phase adjusting layer according to the conventional art, however, there is a problem in that the wavelength dependency of a reflectance is very great and a transmittance and a reflectance for an inspecting light do not satisfy the range by only the control of a transmittance and a reflectance for an exposure wavelength in some cases. For example, the minimum value of a fluctuation in the reflectance for a change in a wavelength reaches an inspection wavelength to be used for the defect inspection of the mask blank. As a result, the reflectance for the inspection wavelength is too low to recognize the reflection intensity of a clean mask blank surface (on which a foreign substance is not present) so that the defect inspection cannot be carried out.

In addition, a light source having the same wavelength is not always used in an apparatus for inspecting the photomask and an apparatus for inspecting the photomask blank. In the inspection for the photomask, furthermore, different light sources are used in an inspection for the defect of the shape of a pattern and an inspection for a foreign substance and a defect in some cases. Under present situations, there are inspecting apparatuses using light sources having wavelengths 364 nm, 266 nm and 257 nm in the inspection for the shape of the pattern of the photomask. On the other hand, light sources having wavelengths of 364 nm and 488 nm are mainstream in an inspection for the foreign substance of the photomask, and the light source having the wavelength of 488 nm is used in most of the defect and foreign substance inspections for the photomask blank. Such a difference is made by a variation in the developing speed of each inspecting apparatus and a period for introducing an apparatus user or a difference in the type and range of a defect and a foreign substance to be objects between the photomask and the photomask blank. Therefore, a transmittance and a reflectance for the inspecting lights of the photomask and the photomask blank are to be adjusted corresponding to various wavelengths. It is hard to fabricate the photomask blank and the photomask in the conventional art. There is caused a situation in which an optical characteristic for the inspecting light having the wavelength of 488 nm is not satisfied if the adjustment is carried out to have an optical characteristic to satisfy the inspecting light having the wavelength of 364 nm, for example.

SUMMARY OF THE INVENTION

In order to solve such a problem, a remedy on the inspecting apparatus side has also been investigated.

For one remedy, the wavelength of an inspecting light is reduced. In general, the halftone phase shifter section absorbs a light having a shorter wavelength more greatly. Consequently, the transmittance of the inspecting light in the halftone phase shifter section can be decreased with a reduction in the wavelength of the inspecting light. While an existing inspecting light is an i ray having a wavelength of 364 nm, the use of a light having a wavelength of approximately 250 nm will be investigated in the future. Under actual circumstances, however, a time is still taken for the spread of such an inspecting apparatus. Furthermore, there is a possibility that a sufficient transmittance cannot be maintained in the vicinity of 250 nm if a reduction in the wavelength of the exposed light progresses.

For another remedy, there is introduced an inspecting technique (hereinafter referred to as an inspecting technique utilizing a reflected light) to increase the resolution of an inspection by utilizing the reflected light of an inspecting light in addition to the transmitted light of the inspecting light. By using the inspecting technique utilizing a reflected light, it is possible to carry out an inspection with high precision even if the transmittance of the inspecting light in the halftone phase shifter section is 50% to 60%. In order to use this method, however, it is necessary to control a reflectance as well as the transmittance of the inspecting light.

In consideration of the problem described above, it is a first object of the invention to provide a halftone type phase shift mask and a halftone type phase shift mask blank which reduce a transmittance for an inspecting light by increasing a reflectance with respect to the inspecting light of a multilayer film in a multilayer type halftone phase shift mask corresponding to a reduction in the wavelength of an exposed light (that is, have a predetermined phase angle and transmittance with respect to the wavelength of the exposed light having a reduced wavelength) or corresponding to an increase in the transmittance of the exposed light of the halftone phase shifter section, thereby reducing the transmittance for the inspecting light.

Moreover, it is a second object of the invention to provide a halftone type phase shift mask and a halftone type phase shift mask blank which can be applied to an inspecting technique utilizing a reflected light corresponding to a reduction in the wavelength of an exposed light or an increase in the transmittance of the exposed light of the halftone phase shifter section.

Furthermore, it is a third object of the invention to provide a halftone type phase shift mask and a halftone type phase shift mask blank which can inspect a pattern appearance with higher precision at the wavelength of an inspecting light in a high transmittance product (a transmittance of 8 to 30%) in an exposed light wavelength region of 140 nm to 200 nm, particularly, in the vicinity of 157 nm to be the wavelength of an $F_2$ excimer laser and the vicinity of 193 nm to be the wavelength of an ArF excimer laser.

In consideration of the problems described above, it is furhter object of the invention to provide a halftone phase shift mask blank and a halftone type phase shift mask which correspond to two different inspection wavelengths and can obtain sufficient precision in an inspection at both of the inspection wavelengths in the inspection using a reflection.

Moreover, it is another object of the invention to provide a halftone phase shift mask blank and a halftone type phase shift mask which can obtain sufficient precision in an inspection by using the light sources of inspecting apparatus for both an i-ray wavelength and a DUV region.

In consideration of the circumstances, it is an object to provide a halftone type phase shift mask blank in which a predetermined transmittance and a phase shift amount are adjusted for an exposed light having a wavelength selected from a wavelength of 140 nm to 200 nm, a defect inspection for the halftone type phase shift mask blank can be carried out and a defect can be guaranteed as the mask blank, a halftone type phase shift mask manufactured by using the halftone type phase shift mask blank, and a method of manufacturing the halftone type phase shift mask blank.

Furthermore, it is another object to provide a halftone type phase shift mask blank capable of inspecting a halftone type phase shift mask manufactured by using the halftone type phase shift mask blank, a halftone type phase shift mask manufactured by using the halftone type phase shift mask blank, and a method of manufacturing the halftone type phase shift mask blank.

The invention has the following structure.

(Structure 1) A halftone type phase shift mask blank including, on a transparent substrate, at least a phase shifter film having a predetermined transmittance for an exposed light and a predetermined phase difference for the transparent substrate, wherein the phase shifter film is formed by a multilayer film in which films including at least two layers having an upper layer formed on the most surface side and a lower layer formed thereunder are provided, and a thickness of the upper layer is adjusted in such a manner that a refractive index of the film to be the upper layer for a wavelength of an inspecting light to be used for inspecting a halftone type phase shift mask manufactured by using the halftone type phase shift mask blank is smaller than that of the film to be the lower layer and a surface reflectance for the inspecting light of the phase shifter film is maximized or approximates to a maximum.

(Structure 2) The halftone type phase shift mask blank according to the structure 1, wherein a thickness d of the upper layer is set within a range of $0.8 \times \lambda'/(2n') \leq d \leq 1.2 \times \lambda'/(2n')$ (in which $\lambda'$ represents a wavelength of an inspecting light to be used in a mask inspection and $n'$ represents a refractive index of the upper layer (a phase adjusting layer) at the wavelength $\lambda'$).

(Structure 3) A halftone type phase shift mask blank including, on a transparent substrate, at least a phase shifter film having a predetermined transmittance for an exposed light and a predetermined phase difference for the transparent substrate, wherein the phase shifter film is formed by a multilayer film in which films including at least two layers having an upper layer formed on the most surface side and a lower layer formed thereunder are provided, and a thickness of the upper layer is adjusted in such a manner that a refractive index of the film to be the upper layer is smaller than that of the film to be the lower layer, a surface reflectance for an inspecting light of the phase shifter film is set within a range of 10 to 40% and a transmittance is 60% or less.

(Structure 4) The halftone type phase shift mask blank according to any of the structures 1 to 3, wherein the phase shifter film is formed by a two-layer film in which a phase angle of an exposed light is converted by approximately 180 degrees and a transmittance for the exposed light is adjusted to 3 to 40%, the upper layer is a phase adjusting layer having a function of mainly adjusting the phase angle for the exposed light, and the lower layer is a transmittance adjusting layer having a function of mainly reducing the transmittance.

(Structure 5) The halftone type phase shift mask blank according to the structure 4, wherein the thickness d of the upper layer is set within a range of $0.44 \times \lambda/(n-1) \leq d \leq 0.56 \times \lambda/(n-1)$ (in which $\lambda$ represents a wavelength of an exposed light and n represents a refractive index of the upper layer at the wavelength $\lambda$).

(Structure 6) The halftone type phase shift mask blank according to any of the structures 1 to 5, wherein the exposed light is an $F_2$ excimer laser.

(Structure 7) The halftone type phase shift mask blank according to any of the structures 1 to 5, wherein the exposed light is an ArF excimer laser and the phase shifter film has a transmittance adjusted to 8 to 30%.

(Structure 8) A halftone type phase shift mask wherein a light transmitting section and a halftone phase shifter section are formed by patterning the phase shifter film in the halftone type phase shift mask blank according to any of the structures 1 to 7.

(Structure 9) The halftone type phase shift mask according to the structure 6, wherein a opaque layer is formed in a desirable region excluding the vicinity of a boundary between the halftone phase shifter section and the light transmitting section.

(Structure 10) A method of manufacturing the halftone type phase shift mask according to the structure 8 or 9, comprising the step of inspecting a pattern appearance of the halftone type phase shift mask.

(Structure 11) A halftone type phase shift mask blank to be used for manufacturing a halftone type phase shift mask in which a light transmitting section for transmitting an exposed light and a phase shifter section for transmitting a part of the exposed light and shifting a phase of the transmitted light by a predetermined amount at the same time are provided on a transparent substrate, and an optical characteristic is designed in such a manner that the lights transmitted in the vicinity of a boundary portion between the light transmitting section and the phase shifter section are canceled each other, and a contrast of an exposed light pattern boundary portion to be transferred onto a surface of an exposed member can be thereby held and improved well, and having a phase shifter film for forming the phase shifter section on the transparent substrate, wherein the phase shifter film is formed by a multilayer film in which films including at least two layers having an upper layer formed on the most surface side and a lower layer formed thereunder are provided, and a thickness of the upper layer is adjusted in such a manner that a refractive index of the film to be the upper layer for a wavelength of an inspecting light to be used for inspecting the halftone type phase shift mask manufactured by using the halftone type phase shift mask blank is smaller than that of the film to be the lower layer and a surface reflectance for the inspecting light of the phase shifter film is a desirable reflectance for at least two different inspection wavelengths.

(Structure 12) The halftone type phase shift mask blank according to the structure 11, wherein the exposed light has a wavelength selected from a wavelength of 140 nm to 200 nm and the at least two inspection wavelengths are selected from a wavelength of 240 to 370 nm.

(Structure 13) The halftone type phase shift mask blank according to the structure 12, wherein the thickness of the upper layer is adjusted in such a manner that the surface reflectance of the phase shifter film is maximized at a wavelength selected from a wavelength of 220 nm to 340 nm.

(Structure 14) The halftone type phase shift mask blank according to any of the structures 11 to 13, wherein the exposed light is an $F_2$ excimer laser.

(Structure 15) The halftone type phase shift mask blank according to any of the structures 11 to 13, wherein the exposed light is an ArF excimer laser and the phase shifter film has a transmittance adjusted to 8 to 30%.

(Structure 16) The halftone type phase shift mask blank according to any of the structures 11 to 15, wherein the phase shifter film is formed by a two-layer film in which a phase angle of the exposed light is converted by approximately 180 degrees and a transmittance for the exposed light is adjusted to 3 to 40%, the upper layer is a phase adjusting layer having a function of mainly adjusting the phase angle for the exposed light, and the lower layer is a transmittance adjusting layer having a function of mainly reducing the transmittance.

(Structure 17) A halftone type phase shift mask wherein a light transmitting section and a halftone phase shifter section are formed by patterning the phase shifter film in the halftone type phase shift mask blank according to any of the structures 11 to 16.

(Structure 18) The halftone type phase shift mask according to the structure 17, wherein a opaque layer is formed in a desirable region excluding the vicinity of a boundary between the halftone phase shifter section and the light transmitting section.

(Structure 19) A method of manufacturing a halftone type phase shift mask comprising the step of inspecting a pattern appearance of the halftone type phase shift mask according to the structure 17 or 18.

(Structure 20) A halftone type phase shift mask blank to be used for manufacturing a halftone type phase shift mask in which a light transmitting section for transmitting an exposed light and a phase shifter section for transmitting a part of the exposed light and shifting a phase of the transmitted light by a predetermined amount at the same time are provided on a transparent substrate, and an optical characteristic is designed in such a manner that the lights transmitted in the vicinity of a boundary portion between the light transmitting section and the phase shifter section are canceled each other, and a contrast of an exposed light pattern boundary portion to be transferred onto a surface of an exposed member can be thereby held and improved well, and having a phase shifter film for forming the phase shifter section on the transparent substrate, wherein the phase shifter film has a predetermined transmittance and phase shift amount adjusted with respect to an exposed light having a wavelength selected from a wavelength of 140 nm to 200 nm by a multilayer film in which films including at least two layers having an upper layer formed on the most surface side and a lower layer formed thereunder are provided, and has a reflectance which can be inspected with respect to an inspecting light to be used in a defect inspection of the halftone type phase shift mask blank.

(Structure 21) The halftone type phase shift mask blank according to the structure 1, wherein the phase shifter film is formed by a two-layer film in which a phase shift amount of the exposed light is converted by approximately 180 degrees and a transmittance for the exposed light is adjusted to be a desirable transmittance selected from 3 to 40%, the upper layer is a phase adjusting layer having a function of mainly adjusting the phase shift amount for the exposed light, and the lower layer is a transmittance adjusting layer having a function of mainly reducing the transmittance.

(Structure 22) The halftone type phase shift mask blank according to the structure 20 or 21, wherein a wavelength of the inspecting light to be used in the defect inspection of the halftone type phase shift mask blank is 488 nm.

(Structure 23) The halftone type phase shift mask blank according to any of the structures 20 to 22, wherein the reflectance of the inspecting light to be used in the defect inspection of the halftone type phase shift mask blank is 1.5% or more.

(Structure 24) The halftone type phase shift mask blank according to any of the structures 20 to 23, wherein the phase shifter film has a transmittance and/or a reflectance which can be inspected with respect to the inspecting light to be used in an inspection of a halftone type phase shift mask manufactured by using the halftone type phase shift mask blank.

(Structure 25) The halftone type phase shift mask blank according to the structure 24, wherein a wavelength of the inspecting light to be used in the inspection of the halftone type phase shift mask manufactured by using the halftone type phase shift mask blank is 240 to 370 nm.

(Structure 26) A method of manufacturing the halftone type phase shift mask blank according to the structures 20 to 25, comprising the steps of:

forming a phase shifter film on a transparent substrate; and carrying out a defect inspection for the phase shifter film, thereby performing a foreign substance and defect guarantee.

(Structure 27) A halftone type phase shift mask wherein a light transmitting section and a halftone phase shifter section are formed by patterning the phase shifter film in the halftone type phase shift mask blank according to the structures 20 to 25.

BRIEF DESCRIPTION OF THE DRAWINGS

FIG. 8 is the Table 1 showing the characteristic of the embodiments and the comparison examples described from FIGS. 1 to 6.

FIG. 15 is a table showing the thickness and composition of a phase shifter film fabricated in the embodiments and comparative examples, FIG. 16 is a table showing a transmittance for an exposure wavelength and a transmittance, a reflectance and a film thickness for an inspection wavelength in the phase shifter film fabricated in the embodiments and the comparative examples.

DESCRIPTION OF THE PREFERRED EMBODIMENTS

Figure 1:
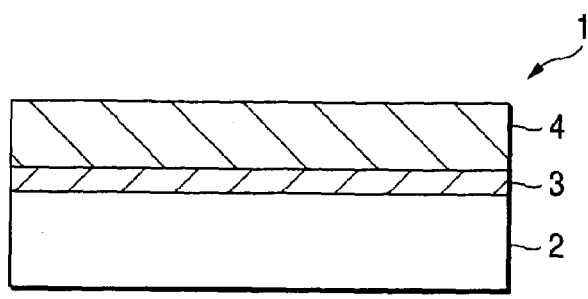
FIG. 1 is a typical view for explaining a halftone type phase shift mask blank.

The various structures in this invention will be further described in their details as follows.

In the case in which a two-layer type halftone phase shifter film comprising an upper layer having a high refractive index and a lower layer having a low refractive index is used, a light reflected by the lower layer and a light reflected by the upper layer cause an interference so that the reflectance of the whole two-layer film describes the curve (reflecting spectrum) of an interference wave with respect to a wavelength. The invention takes note of the reflecting characteristic and can reduce a transmittance for the wavelength of an inspecting light by adjusting a surface reflectance for the wavelength of the inspecting light to be maximized or to approximate to a maximum. Also in any inspecting method, the reduction in the transmittance for the wavelength of the inspecting light contributes to an enhancement in precision in an inspection. By increasing the reflectance for the wavelength of the inspecting light to obtain such a transmittance level as to carry out an inspection utilizing a transmitted light with high precision (setting the reflectance to have a desirable value), it is possible to carry out the inspection utilizing a transmitted light with high precision. By setting a reflected light at the wavelength of the inspecting light to have such a level as to apply an inspecting technique utilizing the transmitted light and the reflected light (setting the reflectance to have a desirable value), moreover, it is also possible to carry out the inspection by means of an inspecting apparatus utilizing a reflection.

According to the structures 1 to 3 of the invention, the phase shifter film is a multilayer film having at least two layers provided, and it is possible to regulate a reflectance for an inspecting light by setting the reflectance of the film to be an upper layer to be smaller than that of the film to be a lower film at an inspection wavelength. Moreover, it is also possible to regulate a reflectance for an exposed light to be equal to or smaller than a desired value by setting the refractive index of the film to be the upper layer to be smaller than that of the film to be the lower layer at an exposing wavelength (structure 1). Referring to the reflectance of the inspecting light, furthermore, the thickness of the film is designed such that the reflectance of the inspecting light of the multilayer film is maximized or approximates a maximum, that is, no cancellation is carried out with the reflected light of the lower layer as much as possible (structure 1). When the reflectance for the inspecting light of the multilayer film is thus increased, the transmittance is relatively decreased if the reflectance is increased. Consequently, it is possible to reduce the transmittance for the inspecting light.

The reflectance of the halftone phase shifter section for an inspecting light having a wavelength $\lambda'$ is maximized in the following case.

$$d=\lambda'/(2n') \quad \text{(Equation 1)}$$

wherein n' represents a refractive index of a phase adjusting layer for the light having the wavelength $\lambda'$. When the reflectance of the inspecting light is increased, the transmittance is relatively decreased with an increase in the reflectance. As compared with the case in which the transmittance is not decreased with the increase in the reflectance as in the invention, precision in the inspection can be enhanced in a pattern appearance inspection utilizing a transmitted light so that the inspection can easily be carried out. By increasing the reflectance of the inspecting light, moreover, it is possible to apply a high resolution inspecting technique utilizing a reflected light in the pattern appearance inspection. In the case in which the Equation 1 is not accurately satisfied (that is, the reflectance is not maximized), the reflectance is not always insufficient. Practically, if the reflectance is set within the following range, that is, a range including the vicinity of a maximum, there is no problem (structure 2).

$$0.8 \times \lambda'/(2n') \leq d \leq 1.2 \times \lambda'/(2n') \quad \text{(Equation 2)}$$

If the range (such a range as to set a higher reflectance) of the Equation 2 is exceeded, the reflectance of the inspecting light is decreased. Consequently, it is hard to carry out a pattern appearance inspection and a foreign substance inspection. At the wavelength $\lambda'$ of the inspecting light, substantially, it is desirable that a transmittance of 40% or less should be realized in an inspection utilizing a transmitted light and that a transmittance of 60% or less (preferably 50% or less) and a reflectance of approximately 10 to 40% (preferably 12 to 30%) should be realized in an inspection utilizing the transmitted light and a reflected light (structure 3). More specifically, the thickness of the upper layer is regulated in such a manner that the reflectance of the inspecting light is maximized or approximates to a maximum. Consequently, it is possible to inspect the pattern appearance by a defect inspecting apparatus by using the transmitted light if the transmittance for the inspecting light is 40% or less. If the transmittance is exceeded, it is hard to detect a pattern defect. Also in the case in which the transmittance for the inspecting light exceeds 40%, that is, 60% and preferably 50% or less, and the reflectance is 10 to 40% and preferably 12 to 30%, it is possible to inspect the pattern appearance in the defect inspecting apparatus using a transmitted light and a reflected light. When the transmittance is exceeded, it is hard to detect the pattern defect even if the reflected light is used together. If the reflectance is less than the lower limit, moreover, it is hard to take a contrast with a transparent substrate. If the reflectance is more than the upper limit, it is hard to carry out the inspection in respect of the apparatus.

According to the structures 1 to 3 of the invention, two layers are not restricted but three layers or more including an upper layer formed on the most surface side (on the opposite side of the transparent substrate) and a lower layer provided thereunder may be used.

In the invention, in addition to the requirement of the structure 1, the upper layer is the phase adjusting layer having the function of mainly adjusting a phase angle for an exposed light and the lower layer is a transmittance adjusting layer having the function of mainly reducing the transmittance, and it is possible to easily provide (design) a suitable halftone type phase shift mask blank to satisfy various conditions by forming the two-layer film in which the phase angle of the exposed light is converted by approximately 180 degrees and the transmittance for the exposed light is adjusted to 3 to 40%, which is preferred (structure 4).

The reason will be described below more specifically.

When a phase shift amount $\phi$ (deg) of an exposed light having a wavelength $\lambda$ which passes through the phase adjusting layer is represented by $\phi$, a thickness d of the phase adjusting layer is expressed in the following equation.

$$d=(\phi/360)\times\lambda/(n-1) \quad \text{(Equation 3)}$$

wherein n represents a refractive index of the phase adjusting layer for a light having the wavelength $\lambda$.

When the phase shift amount of a transmittance adjusting layer is represented by $\phi'$, it is necessary to design a phase shift amount $\phi$ of the halftone phase shifter section in the following manner.

$$\Phi=\phi+\phi'=180°$$

A value of $\phi'$ is set to be approximately $-20° \leq \phi' \leq 20°$. More specifically, the thickness of the transmittance adjusting layer is too great beyond the range so that the transmittance of the exposed light cannot be increased. Accordingly, the thickness d of the phase adjusting layer is designed within the following range.

$$0.44 \times \lambda/(n-1) \leq d \leq 0.56 \times \lambda/(n-1) \quad \text{(Equation 4)}$$

By satisfying both the Equation 4 (the range in which the phase angle of the exposed light can be converted by approximately 180 degrees) (structure 5) and the Equation 2 (the range in which the reflectance can be set to be high) (structure 2), it is possible to carry out an inspection with high precision by increasing the reflectance for the wavelength of the inspecting light while setting the phase shift amount of the exposed light in the phase shifter section to be 180 degrees.

For the film material of the upper layer, it is possible to propose $SiO_x$, $SiO_xN_y$, or $SiO_x$ or $SiO_xN_y$ which contains a very small amount of metals such as Mo, Ta, W, Zr, Cr or Hf, for example. $SiO_xN_y$ is the most preferable for a material having such a combination of n and n' as to satisfy the ranges of the Equations 2 and 4. The reason is that $SiO_xN_y$ is a material which can regulate the thickness of a film, thereby satisfying optimum values in both of the Equations 2 and 4, more specifically, a material which can convert the phase angle of an exposed light by 180 degrees, thereby adjusting a reflectance for the wavelength of an inspecting light to be maximized or to approximate to a maximum. $SiO_xN_y$ can change a ratio (x, y) of oxygen and nitrogen in the film, thereby regulating n and n' to have proper values, respectively. In case of sputtering film formation, for example, the ratio of oxygen to nitrogen in the film can easily be changed by setting Si to be a target and properly regulating the flow rates of oxygen and nitrogen to be used as reaction gases.

Examples of the film material of the lower layer include a film formed by at least one material selected from magnesium, aluminum, titanium, vanadium, chromium, yttrium, zirconium, niobium, molybdenum, tin, lanthanum, tantalum, tungsten, silicon and hafnium or their compounds (oxide, nitride, oxy-nitride).

The invention is particularly suitable for the use of the phase shift mask within the range of a wavelength of an exposed light of 140 nm to 200 nm and a wavelength of an inspecting light of 250 nm to 400 nm.

According to the structure 6, moreover, in the case in which the exposed light is an $F_2$ excimer laser having a wavelength of 157 nm, a light transmittance for the wavelength of the inspecting light (for example, 257 nm, 365 nm) can be reduced to be 40% or less (structure 2). Referring to a mask for the $F_2$ excimer laser, accordingly, the pattern appearance can be inspected with high precision by utilizing the transmitted light.

According to the structure 7, for a product having a high transmittance in the case in which the exposed light is an ArF excimer laser having a wavelength of 193 nm (a transmittance of 8 to 30% at the wavelength of the exposed light of a phase shifter film), it is possible to reduce the light transmittance for the wavelength of the inspecting light (for example, 257 nm, 365 nm) to be 40% or less (structure 2). Referring to the mask for the ArF excimer laser, accordingly, the pattern appearance can be inspected with high precision by utilizing the transmitted light. For the high transmittance product, a preferable transmittance at the wavelength of the exposed light is 9 to 25%.

According to the structures 8 and 10, moreover, it is possible to obtain the halftone type phase shift mask capable of inspecting the pattern appearance.

Figure 7:
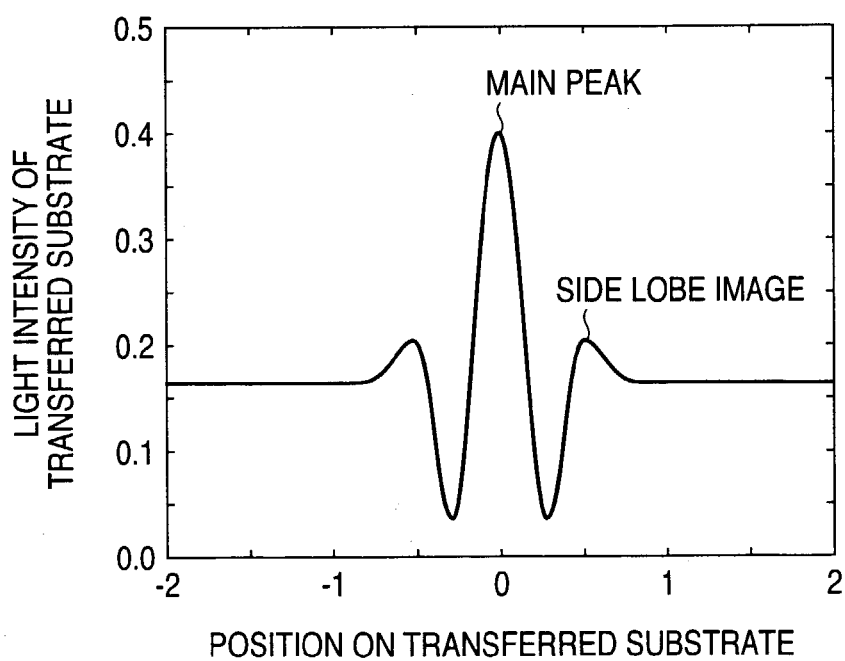
FIG. 7 is a chart for explaining the problem of a side lobe image.
Figure 9:
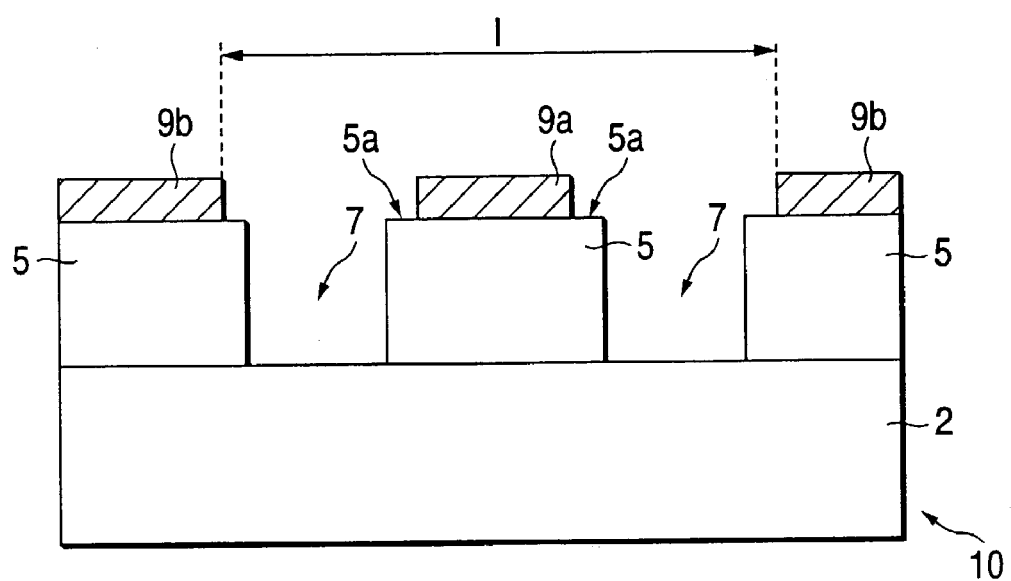
FIG. 9 is a view for explaining an embodiment of a halftone type phase shift mask in this invention.
Figure 10:
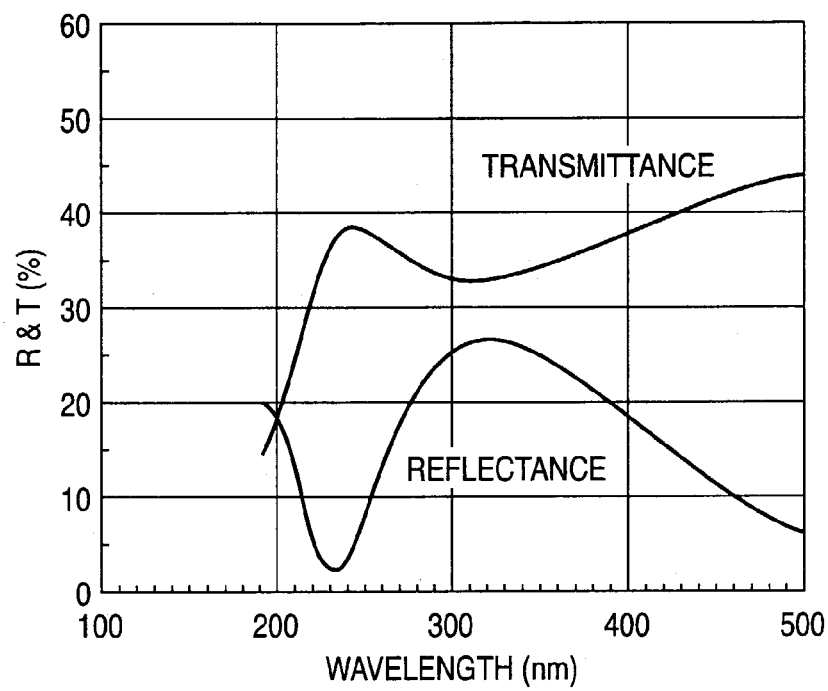
FIG. 10 is a chart showing the transmitting and reflecting spectra of a halftone type phase shift mask blank fabricated in the fourth embodiment.

According to the structure 9, moreover, the opaque layer is formed in the desirable region excluding the vicinity of the boundary between the halftone phase shifter section and the light transmitting section. Consequently, it is possible to obtain the halftone type phase shift mask which can carry out pattern transfer with high precision. In more detail; a region having a high light intensity (a side lobe image) is generated around the halftone phase shifter section in the halftone type phase shift mask (FIG. 7) so that a resist provided on the transferred substrate is exposed in some cases. Consequently, a reduction in the film of the resist on the transferred substrate which is thus generated causes a deterioration in precision in a pattern to be formed. In recent years, particularly, the transmittance of the halftone phase shifter section tends to be increased in order to sufficiently obtain a phase shift effect. In that case, the side lobe image becomes a particularly great problem. As shown in FIG. 9, accordingly, a opaque layer 9a is provided in a desirable region excluding a vicinity 5a of the boundary between a halftone phase shifter section 5 and a light transmitting section 7 over a transparent substrate 2, that is, a region in which the intensity of the side lobe image can be reduced. Consequently, it is possible to obtain a transfer pattern with high precision in which the phase shift effect can sufficiently be obtained and the reduction in the film of the resist over the transferred substrate can be prevented. The structure is particularly effective for a halftone type phase shift mask in which a halftone phase shifter film to be a high transmittance product has a transmittance of 8 to 30%, and preferably 9 to 25%.

Moreover, it is preferable that the halftone time phase shift mask should have a opaque ring 9 in a non-transfer region excluding the transfer region I as shown in FIG. 9. The opaque ring 9 serves to prevent the resist on the transferred substrate from causing the reduction in the film by multiple exposing a light over an object to be transferred in the overlapping portion of an exposure area when exposing a light over a plurality of portions on the transferred substrate by using one mask.

Now, the preferred embodiments of the above-mentioned structures will be described below.

First Embodiment

The example relates to a halftone type phase shift mask blank according to the invention in which the wavelength of an exposed light is set to be 193 nm and the wavelength of an inspecting light is set to be 364 nm. As shown in FIG. 1, a halftone type phase shift mask blank 1 according to the example is obtained by sequentially providing a lower layer 3 formed by Ta (a transmittance adjusting layer) and an upper layer 4 formed by SiON (a phase adjusting layer) on a transparent substrate 2.

In a method of manufacturing a halftone type phase shift mask blank and mask according to the example, the lower layer 3 formed by Ta (the transmittance adjusting layer) is first provided in a thickness of 80 angstrom on the transparent substrate 2 formed of synthetic quartz by a film forming method such as a sputtering process. Next, an Si—O—N film is formed in a thickness of 950 angstrom on the lower layer 3 by a reactive sputtering process using Si as a target and Ar, $O_2$ and $N_2$ as sputter gases so that the upper layer 4 (the phase adjusting layer) is formed. In the example, a flow rate was regulated to obtain $Ar:N_2:O_2=40:59.3:0.7$. Referring to n and n' of the upper layer 4 (Si—O—N film) thus obtained, consequently, n=2.05 and n'=1.76 were obtained and a thickness d=950 angstrom was set within the ranges of the Equations 2 and 4.

Figure 2:
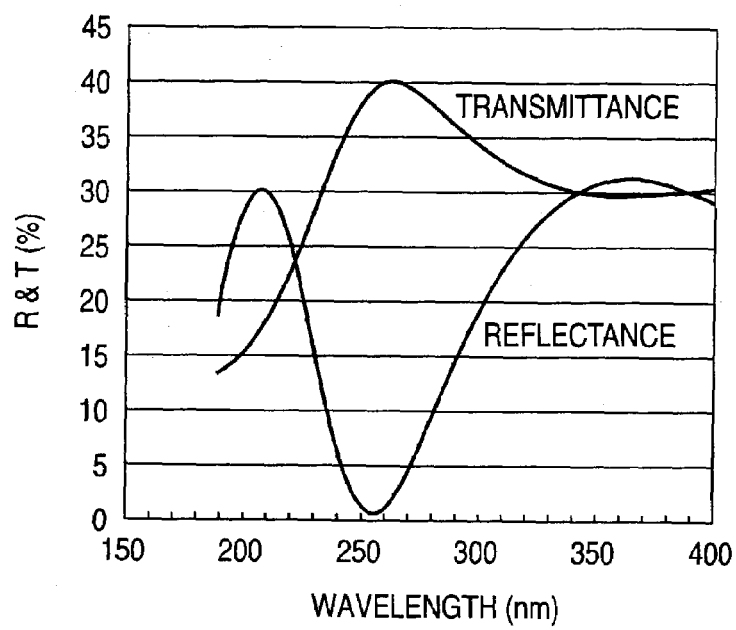
FIG. 2 is a chart showing transmitting and reflecting spectra for the inspecting light of a two-layer film fabricated in the first embodiment.

FIG. 2 shows transmitting and reflecting spectra for the wavelength of an inspecting light for a two-layer film formed by the film forming method. Referring to FIG. 2, a reflectance is increased and a transmittance is decreased at approximately 360 nm in the vicinity of the wavelength of the inspecting light. An exposed light transmittance, an inspecting light transmittance and an inspecting light reflectance were approximately 14%, 30% and 30%, respectively.

The above identified characteristics are shown in Table 1 of FIG. 8.

Next, a opaque ring film containing chromium as a principal component and an electron beam drawing resist are sequentially provided on the two-layer film. Then, pattern drawing is carried out over the resist by an electron beam and development (preferably development using an immersion method) and baking are thereafter performed. Consequently, a resist pattern is formed. Subsequently, the pattern of the opaque ring film is formed by dry etching with a $Cl_2+O_2$ gas using the resist pattern as a mask. Furthermore, the gas is changed to form a pattern in the halftone phase shifter section. In the example, two kinds of gases, that is, a $C_2F_6$ gas and a $Cl_2$ gas are used, and the $C_2F_6$ gas is used for etching the Si—O—N film and the $Cl_2$ gas is used for etching the Ta film. Consequently, an excellent pattern shape was obtained.

Subsequently, the resist on the formed pattern is peeled and is applied to the whole surface again. Then, the drawing and developing process is carried out to form a resist pattern. As shown in FIG. 9, a opaque ring 9b is formed in a non-transfer region excluding a transfer region I by wet etching or dry etching, and at the same time, a opaque layer 9a is formed in a desirable region excluding the vicinity of a boundary between a halftone phase shifter section 5 and a light transmitting section 7 and the resist pattern is peeled. Consequently, a halftone type phase shift mask is obtained.

A difference in a phase between the light transmitting section of the mask thus obtained and the halftone phase shifter section was measured by using a phase difference meter so that a phase difference of 180 degrees was obtained at the wavelength of an exposed light.

In the example 1, moreover, the thickness of the upper layer 4 (the halftone phase shifter section) is regulated in such a manner that a reflectance in the inspecting light is maximized or approximates to a maximum as described with reference to FIG. 2. Consequently, a transmittance for the inspecting light was 40% or less and a pattern appearance was inspected well by a defect inspecting apparatus using a transmitted light (Table 1). In the example 1, furthermore, the transmittance for the inspecting light was 50% or less and the reflectance for the inspecting light was 30 or less. Therefore, the inspection of the pattern appearance could be carried out well by the defect inspecting apparatus using a transmitted light and a reflected light (Table 1).

Figure 3:
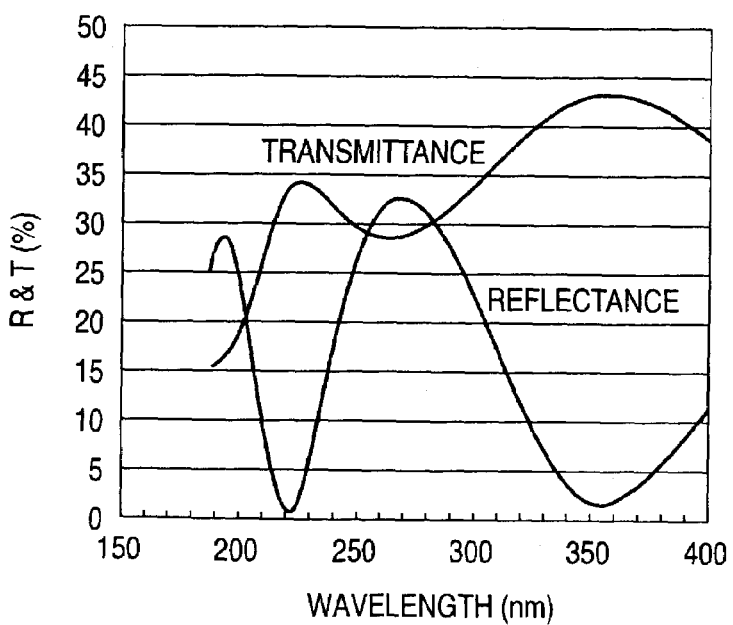
FIG. 3 is a chart showing transmitting and reflecting spectra for the inspecting light of a two-layer film fabricated for a comparison in a comparative example 1.
Figure 4:
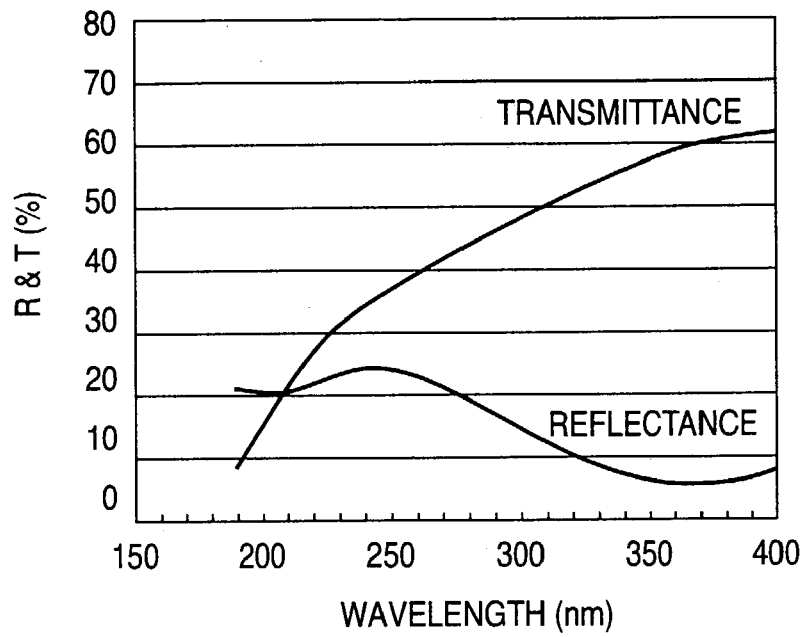
FIG. 4 is a chart showing transmitting and reflecting spectra for the inspecting light of a two-layer film fabricated for a comparison in a comparative example 2.

On the other hand, referring to the halftone phase shifter section, in both the case in which the thickness of the upper layer 4 (phase adjusting layer) is set beyond the range of the Equation 2, that is, is set to be 1500 angstrom (comparative example 1) and the case in which the refractive index of the material of the upper layer 4 is too high and is thereby set beyond the range of the Equation 2 (comparative example 2), a transmittance for the inspecting light exceeds 40% and it is hard to inspect the pattern appearance by means of the defect inspecting apparatus using the transmitted light (Table 1) In the comparative examples 1 and 2, moreover, the reflectance for the inspecting light is less than 10%. For this reason, it is also hard to inspect the pattern appearance by means of the defect inspecting apparatus using the transmitted light and the reflected light. FIG. 3 shows transmitting and reflecting spectra for the inspecting light according to the comparative example 1 and FIG. 4 shows transmitting and reflecting spectra for the inspecting light according to the comparative example 2. As shown in FIGS. 3 and 4, in the comparative examples 1 and 2, a transmittance for the wavelength of an inspecting light ($\lambda'$=364 nm) exceeds 40% so that it is very hard to inspect a defect using a transmitted light, and furthermore, a reflectance for the wavelength of the inspecting light approximates to a minimum value (less than 10%) so that it is very hard to inspect a defect by using the transmitted light and the reflected light.

While Ta is used for the material of the transmittance adjusting layer in the example, it is also possible to utilize a material having a shielding property against an exposed light and an inspecting light such as another metal material. In respect of a chemical resistance and a mask processing, a material containing Si, $SiN_x$, Ta, $TaN_x$, Cr, Zr, $MoSi_x$ or $TaSi_x$ as a principal component is desirable.

Second Embodiment

The example relates to the fabrication of a halftone type phase shift mask according to the invention in which the wavelength of an exposed light is set to be 157 nm and the wavelength of an inspecting light is set to be 257 nm.

A lower layer 3 formed by TaN (a transmittance adjusting layer) is first provided in a thickness of 80 angstrom on a transparent substrate 2 formed of synthetic quartz by a film forming method such as a sputtering process. Next, an Si—O—N film is formed in a thickness of 750 angstrom on the lower layer 3 by a reactive sputtering process using Si as a target and Ar, $O_2$ and $N_2$ as sputter gases so that an upper layer 4 (a phase adjusting layer) is formed. In that case, in the example, a flow rate was regulated to have Ar:$N_2$:$O_2$=40:59:1. Referring to n and n' of the upper layer 4 (Si—O—N film) thus obtained, consequently, n =2.00 and n'=1.79 were obtained and a thickness d=750 angstrom was set within the ranges of the Equations 2 and 4.

Figure 5:
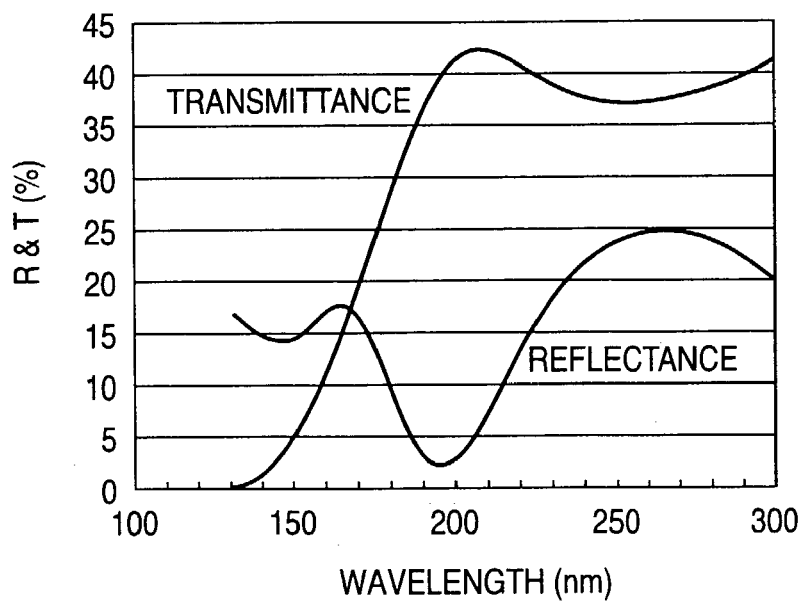
FIG. 5 is a chart showing transmitting and reflecting spectra for the inspecting light of a two-layer film fabricated in the second embodiment.

FIG. 5 shows transmitting and reflecting spectra for the inspecting light of a two-layer film formed by the film forming method. Referring to FIG. 5, a reflectance is increased and a transmittance is decreased at approximately 260 nm in the vicinity of the wavelength of the inspecting light. An exposed light transmittance, an inspecting light transmittance and an inspecting light reflectance were 9.5%, 37% and 24%, respectively.

Next, a pattern processing was carried out by the same method as that in the example 1 so that a halftone type phase shift mask was obtained. The shape of the pattern of the mask thus obtained was excellent.

In the second embodiment, moreover, the thickness of the upper layer 4 (the halftone phase shifter section) is regulated in such a manner that a reflectance in the inspecting light is maximized or approximates to a maximum as described with reference to FIG. 5. Consequently, a transmittance for the inspecting light was 40% or less and a pattern appearance was inspected well by a defect inspecting apparatus using a transmitted light as shown in Table of FIG. 8. In the second embodiment, furthermore, the transmittance for the inspecting light was 50% or less and the reflectance for the inspecting light was 30 or less. Therefore, the inspection of the pattern appearance could also be carried out well by the defect inspecting apparatus using a transmitted light and a reflected light.

Third Embodiment

The example relates to the fabrication of a halftone type phase shift mask according to the invention in which the wavelength of an exposed light is set to be 157 nm and the wavelength of an inspecting light is set to be 257 nm.

A lower layer 3 formed by Zr (a transmittance adjusting layer) is first provided in a thickness of 80 angstrom on a transparent substrate 2 formed of synthetic quartz by a film forming method such as a sputtering process. Next, an Si—O—N film is formed in a thickness of 770 angstrom on the lower layer 3 by a reactive sputtering process using Si as a target and Ar, $O_2$ and $N_2$ as sputter gases so that an upper layer 4 (a phase adjusting layer) is formed. In that case, in the example, a flow rate was regulated to have $Ar:N_2:O_2=40:59.3:0.7$. Referring to n and n' of the upper layer 4 (Si—O—N film) thus obtained, consequently, n=2.05 and n'=1.80 were obtained and a thickness d=770 angstrom was set within the ranges of the Equations 2 and 4.

Figure 6:
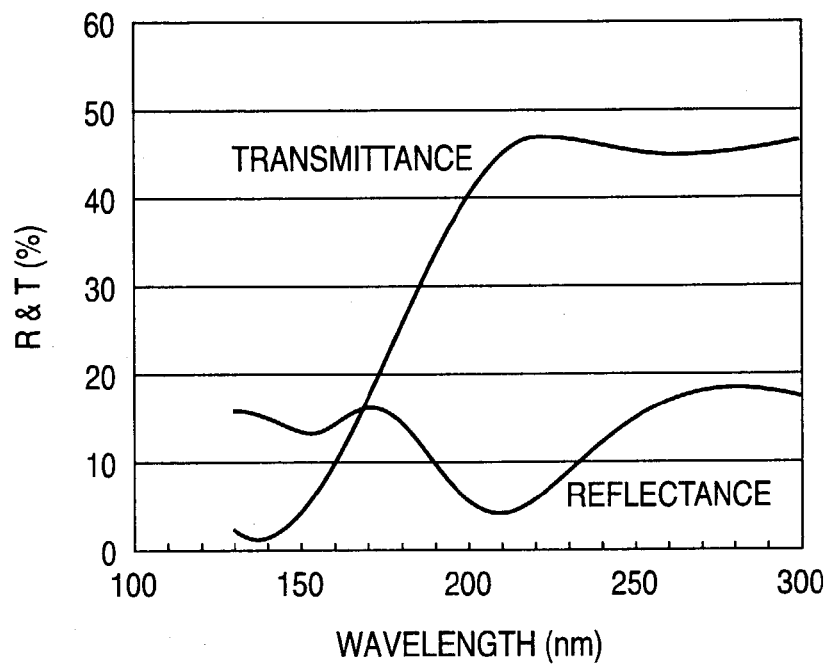
FIG. 6 is a chart showing transmitting and reflecting spectra for the inspecting light of a two-layer film fabricated in third embodiment.

FIG. 6 shows transmitting and reflecting spectra for the inspecting light of a two-layer film formed by the film forming method. Referring to FIG. 6, a reflectance is increased and a transmittance is decreased at approximately 260 nm in the vicinity of the wavelength of the inspecting light. An exposed light transmittance, an inspecting light transmittance and an inspecting light reflectance were 7.5%, 45% and 16%, respectively.

Next, a pattern processing was carried out by the same method as that in the example 1 so that a halftone type phase shift mask was obtained. The shape of the pattern of the mask thus obtained was excellent.

In the third embodiment, moreover, the thickness of the upper layer 4 (the halftone phase shifter section) is regulated in such a manner that a reflectance in the inspecting light is maximized or approximates to a maximum as described with reference to FIG. 6. Therefore, a transmittance for the inspecting light was 50% or less and a reflectance for the inspecting light was 30 or less. Thus, the inspection of the pattern appearance could be carried out well by a defect inspecting apparatus using a transmitted light and a reflected light as shown in Table 1 of FIG. 8.

Turning to the structures 11 to 19 in this invention, their details will be described as below.

The invention is characterized by a halftone type phase shift mask blank wherein a phase shifter film is formed by a multilayer film in which films including at least two layers having an upper layer formed on the most surface side and a lower layer formed thereunder are provided, and a thickness of the upper layer is adjusted in such a manner that a refractive index of the film to be the upper layer for a wavelength of an inspecting light to be used for inspecting a halftone type phase shift mask manufactured by using the halftone type phase shift mask blank is smaller than that of the film to be the lower layer and a surface reflectance for the inspecting light of the phase shifter film is a desirable reflectance for at least two different inspection wavelengths.

More specifically, according to the invention, the phase shifter film is formed by a multilayer film having at least two layers provided. By setting the refractive index of the film to be the upper layer at the inspection wavelength to be smaller than that of the film to be the lower layer, it is possible to adjust the reflectance for the inspecting light. By setting the refractive index of the film to be the upper layer to be lower than that of the film to be the lower layer at an exposure wavelength, moreover, it is possible to adjust a reflectance for an exposed light to be equal to or smaller than a desirable value. In the case in which a two-layer type halftone phase shifter film including an upper layer having a high refractive index and a lower layer having a low refractive index is used, a light reflected by the lower layer and a light reflected by the upper layer cause an interference and the reflectance of the whole two-layer film describes the curve of an interference wave (a reflecting spectrum) for a wavelength. Therefore, the invention can realize a desirable reflectance at two different inspection wavelengths by adjusting the thickness of the upper layer, thereby setting the maximum value of the reflecting spectrum between predetermined wavelengths, that is, two different inspection wavelengths.

The inspection includes a pattern defect inspection and a foreign substance and appearance inspection of the mask blank or the mask.

Moreover, a reflectance which can be used in these inspections is 5 to 40%, and preferably 10 to 30% in respect of a reflectance detection sensitivity.

More specifically, description will be given to a halftone type phase shift mask blank having a two-layer structure to correspond to inspecting lights having both of wavelengths of an i-ray (365 nm) and a DUV (240 to 300 nm, for example, 257 nm).

The reflectance of the halftone phase shifter section for an inspecting light having a wavelength λ is maximized with d=λ/(2n) wherein n represents a refractive index of the upper layer for the light having the wavelength λ.

In the invention, λ is set to be 220 nm to 340 nm so that desirable reflectances can be obtained in both the i-ray and the DUV. Consequently, the inspection can be carried out by using both the i-ray and the DUV.

In the invention, moreover, the phase shifter film is formed by a two-layer film in which the phase angle (phase shift amount) of an exposed light is converted by approximately 180 degrees and a transmittance for the exposed light is adjusted to 3 to 40%, the upper layer is a phase adjusting layer having a function of mainly adjusting the phase angle (phase shift amount) for the exposed light and the lower layer is a transmittance adjusting layer having a function of mainly reducing a transmittance in order to reduce a wavelength (140 nm to 200 nm), more specifically, to obtain a blank to be suitably used at 157 nm to be the wavelength of an $F_2$ excimer laser and 193 nm to be the wavelength of an ArF excimer laser (particularly, a high transmittance product having a transmittance of 8 to 30%).

The phase adjusting layer has the function of mainly adjusting a phase, and furthermore, the function of adjusting a transmittance. On the other hand, the transmittance adjusting layer has the function of mainly adjusting a transmittance, and furthermore, the function of adjusting a phase.

More specifically, in the case in which the phase shift angle of the exposed light to be demanded as the phase shifter film in the halftone type phase shift mask blank (the halftone type phase shift mask) is represented by A (deg), the following relationship can be obtained:

$$0<\phi 2<\phi 1<A(\deg) \quad \text{(Equation 5)}$$

wherein the phase shift amount of the exposed light by the phase adjusting layer is represented by φ1 and the phase shift amount of the exposed light by the transmittance adjusting layer is represented by φ2.

In case of the two-layer structure in which the upper layer is the layer (the phase adjusting layer) to fulfill the function of mainly adjusting the phase shift amount and the lower layer is the layer (the transmittance adjusting layer) to fulfill the function of mainly adjusting the transmittance, moreover, the following film design is carried out, for example.

More specifically, a thickness d of the phase adjusting layer is expressed in the following equation:

$$d=(\phi 1/360)\times \lambda/(n-1) \quad \text{(Equation 6)}$$

wherein a phase shift amount $\phi$ (deg) of an exposed light having a wavelength $\lambda$ which passes through the upper layer (the phase adjusting layer) is represented by $\phi 1$. Herein, n represents the refractive index of the phase adjusting layer for the light having the wavelength $\lambda$.

It is necessary to design a phase shift amount $\Phi$ of the halftone phase shifter section in the following manner:

$$\Phi=\phi 1+\phi 2=A \text{ (deg)} \quad \text{(Equation 7)}$$

wherein the phase shift amount of the lower layer (the transmittance adjusting layer) is represented by $\phi 2$. A value of $\phi 2$ is set within a range of approximately $-20°\leq \phi 2 \leq 20°$. More specifically, the thickness of the lower layer is too great beyond the range so that the transmittance of the exposed light cannot be increased. Accordingly, the thickness d of the upper layer is designed within the following range:

$$0.44\times \lambda/(n-1)\leq d \leq 0.56\times \lambda/(n-1) \quad \text{(Equation 8)}$$

The phase shift amount of the halftone phase shifter film is ideally 180 degrees and is preferably set practically within a range of 180°±5°.

In respect of pattern transfer, moreover, the transmittance of the exposed light is 3 to 20% and preferably 6 to 20%, and the reflectance of the exposed light is 40% or less, preferably 30% or less, and more preferably 20% or less.

In the invention, there can be proposed a method of uniformly increasing a reflecting spectrum from an exposure wavelength to an inspection wavelength and a method of preventing the reflecting spectrum from being minimized at the wavelength of the inspecting light in order not to excessively reduce a reflectance at the wavelength of 488 nm, for example. It is possible to achieve the former method by adjusting the thickness of the lower layer (the transmittance adjusting layer) to be increased within such a range that the optical characteristic of the exposed light is not damaged. In the latter method, it is possible to shift a minimum value present in the vicinity of 500 nm of the reflecting spectrum toward the long wavelength side by adjusting the thickness of the phase adjusting layer to be increased.

In the invention, for the material of the transmittance adjusting layer, it is possible to use a film having at least one selected from metals or silicon or their oxides or nitrides. More specifically, it is possible to use a film formed by at least one material selected from aluminum, titanium, vanadium, chromium, zirconium, niobium, molybdenum, lanthanum, tantalum, tungsten, silicon and hafnium or their nitrides. In particular, it is preferable that the transmittance adjusting layer should contain Ta as a principal component and at least one element in additional elements Cr, Zr, Ti, Al and Hf. By containing tantalum as a principal component, it is possible to obtain a chemically stable layer. In a wavelength region including an inspection wavelength for the inspection of a mask which will be described below, moreover, it is possible to uniformly reduce a transmittance. It is preferable that the additional element should contain 2 to 50 atomic %. In the case in which the content is less than 2 atomic %, the function of an etching stopper for the phase adjusting layer to be the upper layer is deteriorated. Consequently, there is a possibility that a pattern with high precision cannot be obtained. In the case in which the content is more than 50 atomic %, moreover, there is a possibility that the chemical durability of a sputter target or a film cannot be obtained.

Moreover, a thin film containing silicon such as silicon oxide, silicon nitride or silicon oxy-nitride for a base material is preferable for the phase adjusting layer in that a comparatively high transmittance can easily be obtained for an exposed light in an ultraviolet region. These materials may contain a very small amount of metals (5 at % or less). Furthermore, since the refractive indices of these materials can easily be controlled, they are also excellent in the controllability of a phase shift angle to be the main point of the phase shifter. In addition, a main bone to be a film material is silicon oxide or silicon nitride. Therefore, an excellent chemical durability can be obtained. More specifically, a material substantially comprising silicon, oxygen and nitrogen or a material containing at least one selected from phosphorus, boron and carbon has an advantage that the thickness of a film can be reduced, and therefore, is the most preferable. In that case, it is preferable that the content of each of silicon, nitrogen and oxygen should be 35 to 45% for silicon, 5 to 60% for nitrogen and 1 to 60% for oxygen with atomic % in order to maintain a transmittance at an exposure wavelength. When the content of silicon is more than 45%, that of nitrogen is more than 60% or that of oxygen is less than 1%, it is hard to maintain the transmittance at the exposure wavelength. When the content of silicon is less than 35%, that of nitrogen is less than 5% or that of oxygen is more than 60%, such a film thickness as to obtain a sufficient phase shift amount is increased, which is disadvantageous to an etching processing with high precision.

For example, in the case in which the transmittance adjusting layer is a film formed by at least one selected from metals or silicon and the phase adjusting layer is formed by a material substantially comprising silicon, oxygen and nitrogen or a material obtained by causing them to contain at least one selected from phosphorus, boron and carbon, the thickness of the transmittance adjusting layer is set to be 80 angstrom or more so that a reflecting spectrum from an exposure wavelength to an inspection wavelength can be raised uniformly, and the thickness of the phase adjusting layer is set to be 750 angstrom or more so that a reflectance within a wavelength range of 200 nm to 500 nm can be prevented from being minimized. By using at least one of the methods, accordingly, it is possible to carry out control to prevent the reflectance for the inspection wavelength from being excessively reduced.

The phase adjusting layer can usually be etched by dry etching using a fluorinated gas. For the fluorinated gas, for example, $C_xF_y$ (for example, $CF_4$, $C_2F_6$, $C_3F_8$), $CHF_3$, $SF_6$ or their mixed gases may be used or may contain $O_2$ or a rare gas (He, Ar, Xe) to be an additional gas.

Moreover, it is preferable that the transmittance adjusting layer should function as an etching stopper in the etching of the phase adjusting layer. The etching stopper is a film formed by a material having a function of blocking the progress of the etching of the phase adjusting layer or a film formed by a material having a function of easily detecting the end point of the etching of the phase shifter film or both of the functions.

In the former case in which the transmittance adjusting layer is the film formed by a material having the function of blocking the progress of the etching of the phase adjusting layer, it is to be a film which has a resistance to a fluorinated gas and can be etched by using a different gas from the fluorinated gas.

It is preferable that a chlorinated gas should be used for the different gas from the fluorinated gas in that the damage of a transparent substrate can be reduced. For the chlorinated gas, $Cl_2$, $BCl_3$, HCl or their mixed gases may be used or may contain a rare gas (He, Ar, Xe) to be an additional gas. It is also possible to use a gas containing fluorine and a gas other than the fluorine together. In that case, however, a higher ratio of excitation species to active species in a plasma is set to be predominant. The gas containing more fluorine excitation species is defined to be the fluorinated gas and the gas containing more chlorinated excitation species is defined to be the chlorinated gas. In the case in which the gas contains the fluorine and other halogen elements in a simple gas composition (for example, $ClF_3$), it is defined to be the fluorinated gas.

It is preferable that an etching selection ratio of the transmittance adjusting layer to the transparent substrate should be 5 or more in order to carry out substantial CD control by etching the phase adjusting layer. More specifically, it is possible to shorten a time taken for overetching by increasing the etching rate of the lower layer. Consequently, the influence of the etching of the lower layer (the transmittance adjusting layer) on the phase adjusting layer can be reduced as much as possible.

For a material capable of setting the etching selection ratio to the transparent substrate to be 5 or more in dry etching using the chlorinated gas, the material of the lower layer (the transmittance adjusting layer) is formed by a material (a first material) containing a simple metal body selected from a first group comprising Al, Ga, Hf, Ti, V and Zr or at least two of them or the material of the lower layer (the transmittance adjusting layer) is formed by a material (a second material) obtained by adding at least one selected from the first group to one of the metals which is selected from a second group comprising Cr, Ge, Pd, Si, Ta, Nb, Sb, Pt, Au, Po, Mo and W. Alternatively, the material of the lower layer (the transmittance adjusting layer) may be obtained by causing the simple metal body, the first material or the second material to contain nitrogen and/or carbon.

For the chlorine gas, particularly, Zr, Hf, TaZr, TaHf and HfSi are preferable because the etching selection ratio is equal to or more than 5 and the time taken for overetching can be therefore shortened.

Figure 13:
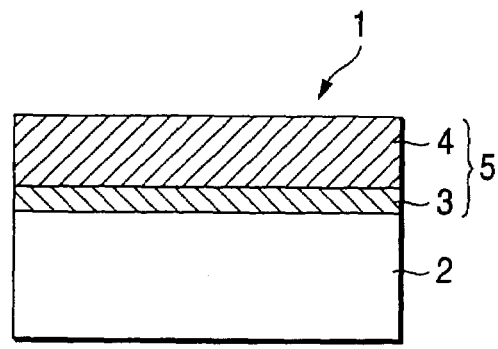
FIGS. 13(a) to 13(d) show the views showing a process for manufacturing a halftone type phase shift mask blank and a halftone type phase shift mask according to the to the embodiments of the invention.
Figure 13:
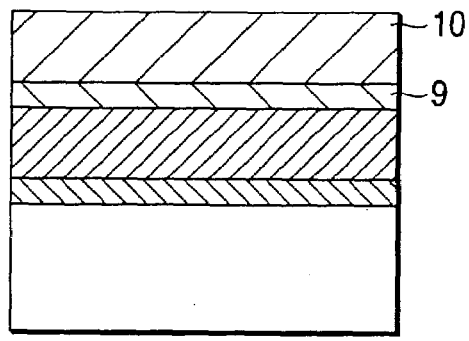
Figure 13:
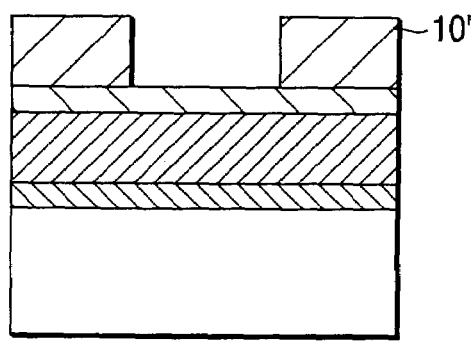
Figure 13:
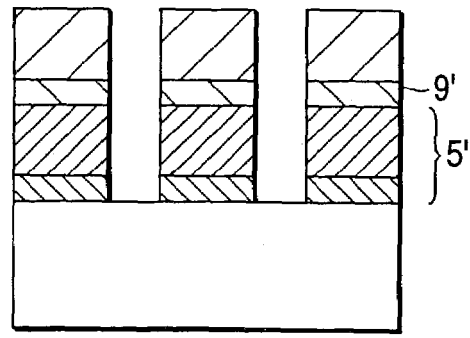
Figure 14:
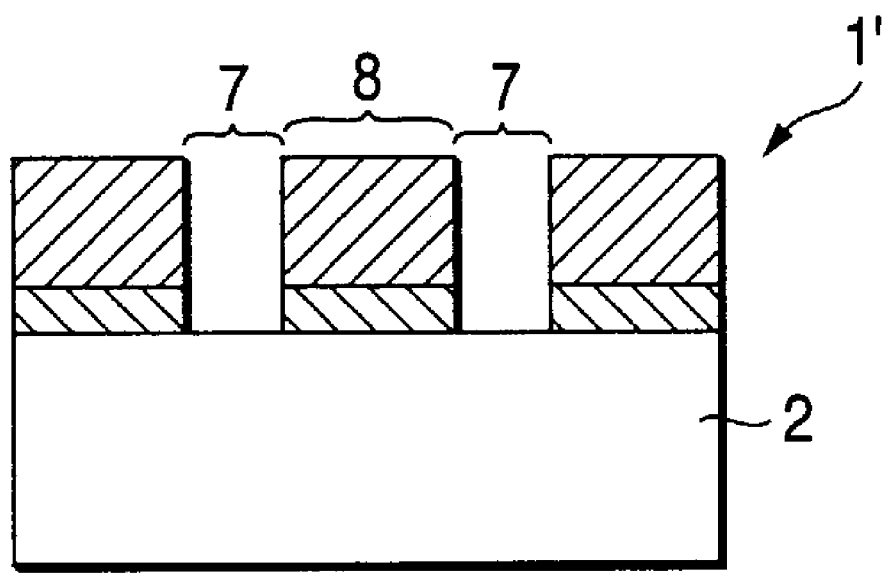
FIG. 14 is a typical sectional view showing a configuration of the halftone type phase shift mask.

According to the invention, moreover, the opaque layer is formed in the desirable region excluding the vicinity of the boundary between the halftone phase shifter section and the light transmitting section. Consequently, it is possible to obtain a halftone type phase shift mask of a so-called tritone type which can carry out pattern transfer with high precision. In more detail, a region having a high light intensity (a side lobe image) is generated around the halftone phase shifter section in the halftone type phase shift mask (FIG. 13) so that the resist provided on the transferred substrate is exposed in some cases. Consequently, a reduction in the film of the resist on the transferred substrate which is thus generated causes a deterioration in precision in a pattern to be formed. In recent years, particularly, the transmittance of the halftone phase shifter section tends to be increased in order to sufficiently obtain a phase shift effect. In that case, the side lobe image becomes a particularly great problem. As shown in FIG. 14, accordingly, a opaque layer 9a is provided in a desirable region excluding a vicinity 5a of the boundary between a halftone phase shifter section 5 and a light transmitting section 7 over a transparent substrate 2, that is, a region in which the intensity of the side lobe image can be reduced. Consequently, it is possible to obtain a transfer pattern with high precision in which the phase shift effect can sufficiently be obtained and the reduction in the film of the resist over the transferred substrate can be prevented. The structure is particularly effective for a halftone type phase shift mask in which a halftone phase shifter film to be a high transmittance product has a transmittance of 8 to 30%, and preferably 9 to 25%.

Moreover, it is preferable that the halftone time phase shift mask should have a opaque ring 9b in a non-transfer region excluding a transfer region I as shown in FIG. 14. The opaque ring 9b serves to prevent the resist on the transferred substrate from causing the reduction in the film by multiple exposing a light over an object to be transferred in the overlapping portion of an exposure area when exposing a light over a plurality of portions on the transferred substrate by using one mask.

In the invention, preferably, there should be the optical characteristic of a phase shifter film such that an inspection can be carried out for a wavelength in a defect inspection and a pattern appearance inspection for the mask, more specifically, the wavelengths of an i-ray (365 nm) and a DUV (240 to 300 nm, for example, 266 nm, 257 nm).

More specifically, the transmittance of the phase shifter section at the wavelength of the inspecting length is to be 50% or less and more desirably 40% or less in order to take a contrast of the light semi-transmitting section and the light transmitting section in an inspection for the shape of the pattern of the photomask and a foreign substance inspection. For the same reasons, moreover, it is desirable that the reflectance of the phase shifter section for the wavelength of the inspecting light is 9% or more in the foreign substance inspection of the photomask. In the case in which a so-called tritone mask having a light transmitting section, a light semi-transmitting section and a shielding section on the light semi-transmitting section is to be inspected, furthermore, a reflecting contrast is required for each of the light transmitting section/the light semi-transmitting section, the light semi-transmitting section/the shielding section, and the light transmitting section/the shielding section. More specifically, the reflectance of the light semi-transmitting section at the wavelength of the inspecting light is desirably 9% to 35%, and more desirably 10% to 30%. On the other hand, the reflectance of the phase shifter film at the wavelength of the inspecting light is desirably 1.5% or more and more desirably 2% or more in order to confirm the position of a clean film surface.

For the transparent substrate according to the invention, a synthetic quartz substrate can be used. In the case in which the $F_2$ excimer laser is used as the exposed light, particularly, it is possible to utilize an F doped synthetic quartz substrate and a calcium fluoride substrate.

Fourth Embodiment

In the example, description will be given to a method of fabricating a mask corresponding to both an inspection wavelength of 257 nm and an i-ray (364 nm) by the light exposure of an ArF excimer laser in a halftone phase shift mask according to the invention.

A Ta—Hf film is formed in a thickness of 65 angstrom on a synthetic quartz substrate by using a Ta—Hf alloy target and Ar to be a sputter gas. Next, an SiON film fabricated by regulating a gas flow to have a refractive index of n=2.1 and an attenuation coefficient of k=0.12 at a wavelength of 193 nm is formed in a thickness of 840 angstrom by using an Si target and Ar, $O_2$ and $N_2$ as sputter gases. Thus, a phase shifter film is obtained.

Figure 11:
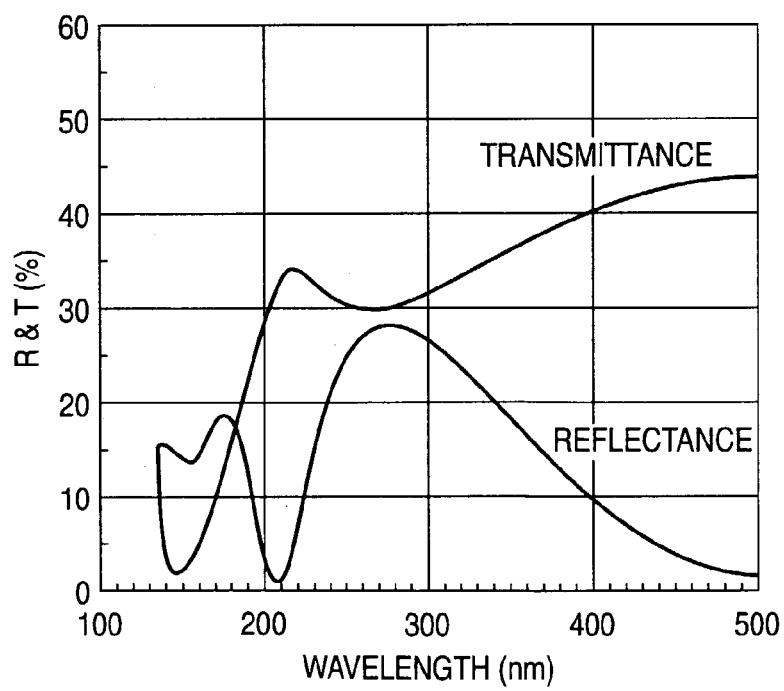
FIG. 11 is a chart showing the transmitting and reflecting spectra of a halftone type phase shift mask blank fabricated in fifth embodiment.

FIG. 11 shows the transmitting and reflecting spectra of the phase shifter film formed by the film forming method. A wavelength to satisfy an Equation 1 is set to be λ=310 nm. Light reflectances at wavelengths of 257 nm and 364 nm are 12.0% and 23.6% respectively and are set within such a range that an inspection can be carried out for both inspection wavelengths. Moreover, a light transmittance at the wavelength of 193 nm of the ArF excimer laser was 15.2%.

As shown in FIG. 13(a), next, a opaque ring film 9 containing chromium as a principal component and an electron beam drawing resist 10 are sequentially provided on a phase shifter film 5 described above which is constituted by a transmittance adjusting layer 3 comprising Ta—Hf and a phase adjusting layer 4 comprising SiON over a transparent substrate 2 formed by a synthetic quartz substrate (FIG. 13(b)). A pattern is drawn over the resist 10 by an electron beam and developer immersion and baking are then carried out to form a resist pattern 10' (FIG. 13(c)). Subsequently, the opaque ring film 9 is subjected to patterning using the resist pattern 10' as a mask by dry etching with a $Cl_2+O_2$ gas (FIG. 13(d)). Furthermore, the phase shifter film is subjected to the patterning by changing the gas and using the opaque ring film as a mask (FIG. 13(d)). In the example, the etching of the phase adjusting layer 4 was carried out with $CF_4+O_2$, and subsequently, the etching of the transmittance adjusting layer 3 was carried out with a $Cl_2$ gas. The end point of the etching was detected by a reflecting optical system and the end point of each layer was distinguished with the inflection point of a reflected light intensity profile. The sectional shape of the phase shifter film thus patterned was observed. Consequently, a vertical section was observed.

Next, the resist provided on the formed pattern is peeled and the resist is applied onto the whole surface again, and a drawing and developing process is then carried out to form a resist pattern (not shown) on the peripheral edge of a mask pattern in such a manner that a opaque layer 9a is formed in a desirable region excluding the opaque ring pattern 9b and the vicinity of a boundary between the halftone phase shifter section 5 and the light transmitting section 7 (see FIG. 5). By wet etching or dry etching, then, Cr provided in portions other than the opaque ring pattern 9b and the opaque layer 9a is removed to obtain the halftone type phase shift mask (see FIG. 9). By using a phase difference meter, a phase difference between the light transmitting section of the mask and the halftone phase shifter section was measured to be 180 degrees at an exposure wavelength.

Referring to the halftone phase shift mask obtained in the fourth embodiment, a defect and foreign substance inspection and a pattern appearance inspection (Starlight, Terascan) were carried out at light source wavelengths of 257 nm and 364 nm. As a result of both of the inspections, consequently, there could be obtained a measuring sensitivity and a measuring reproducibility which are excellent.

Fifth Embodiment

In the example, description will be given to a method of fabricating a mask corresponding to the light exposure of an $F_2$ excimer laser in a halftone phase shift mask according to the invention.

A Ta—Hf film is formed in a thickness of 70 angstrom on a synthetic quartz substrate by using a Ta—Hf alloy target and Ar to be a sputter gas. Next, an SiON film fabricated by regulating a gas flow to have a refractive index of n=2.1 and an attenuation coefficient of k=0.25 at a wavelength of 157 nm is formed in a thickness of 780 angstrom by using an Si target and Ar, $O_2$ and $N_2$ as sputter gases. Thus, a phase shifter film is obtained.

FIG. 11 shows the transmitting and reflecting spectra of the phase shifter film formed by the film forming method. A wavelength to satisfy an Equation 1 is set to be λ=260 nm. Light reflectances at wavelengths of 257 nm and 364 nm are 26.7% and 15.7% respectively and are set within such a range that an inspection can be carried out for both inspection wavelengths.

Moreover, a light transmittance at a wavelength of 157.6 nm of the $F_2$ excimer laser was 6.1%.

Subsequently, a mask pattern and a opaque ring are formed in the same manner as in the fourth embodiment. Consequently, the halftone phase shift mask is obtained. By using a phase difference meter, a phase difference between the light transmitting section of the mask and the halftone phase shifter section was measured to be 180 degrees at an exposure wavelength.

Referring to the halftone phase shift, mask obtained in the fifth embodiment, a defect and foreign substance inspection and a pattern appearance inspection (Starlight, Terascan) were carried out at light source wavelengths of 257 nm and 364 nm. As a result of both of the inspections, consequently, there could be obtained a measuring sensitivity and a measuring reproducibility which are excellent.

COMPARATIVE EXAMPLE

Figure 12:
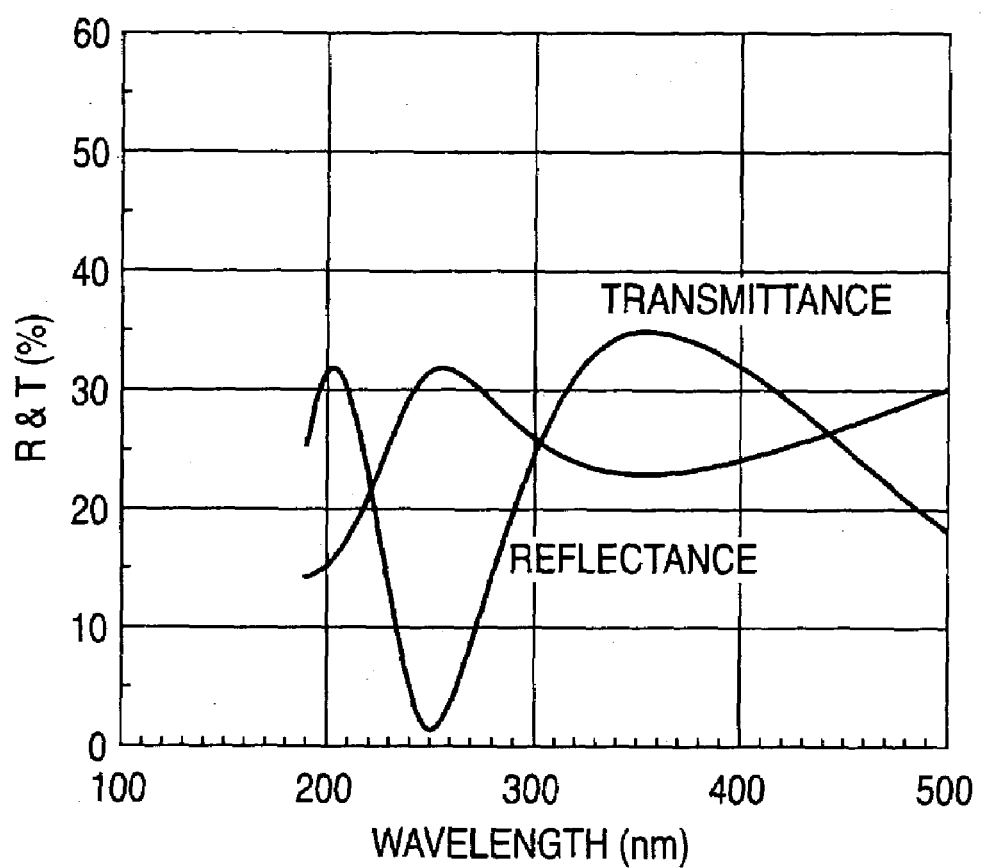
FIG. 12 is a chart showing the transmitting and reflecting spectra of a halftone type phase shift mask blank fabricated in a comparative example.

On the other hand, FIG. 12 shows the transmitting and reflecting spectra of a phase shifter film comprising a transmittance adjusting layer formed by a Ta—Hf film having a thickness of 100 angstrom and a phase adjusting layer formed by an SiON film having a thickness of 1000 angstrom with a refractive index of n=1.9 and an attenuation coefficient of k=0.03 at a wavelength of 193 nm. A wavelength to satisfy the equation 1 was set to be λ=364 nm. Light reflectances at wavelengths of 257 nm and 364 nm are 2.3% and 35.2% respectively, and the reflectance at the wavelength of 257 nm is very small. A light transmittance of the phase shifter film at the wavelength of 193 nm in an ArF excimer laser was 15.2%. Referring to a halftone phase shift mask obtained by patterning the phase shifter film in the same process as that in the example 1, moreover, a phase difference between the light transmitting section of the mask and the halftone phase shifter section was measured to be 180 degrees at the wavelength of 193 nm in the ArF excimer laser by using a phase difference meter.

Referring to the halftone phase shift mask thus obtained, a defect and foreign substance inspection and a pattern appearance inspection (Starlight, Terascan) were carried out at light source wavelengths of 257 nm and 364 nm plural times. Consequently, there could be obtained an inspection sensitivity and a measuring reproducibility which are excellent at the light source wavelength of 364 nm. In the pattern appearance inspection at the light source wavelength of 257 nm, a reflecting contrast with the light transmitting section was insufficient. For this reason, the imaging of a pattern could not be carried out. In the defect and foreign substance inspection at the light source wavelength of 257 nm, the reproducibility of the distribution of a particle size was insufficient.

Turning to the structures 20 to 27 in this invention, they are characterized by the halftone type phase shift mask blanks, wherein a phase shifter film has a predetermined transmittance and phase shift amount adjusted with respect to an exposed light having a wavelength selected from a wavelength of 140 nm to 200 nm by a multilayer film in which films including at least two layers having an upper layer formed on the most surface side and a lower layer formed thereunder are provided, and has a reflectance which can be inspected with respect to an inspecting light to be used in a defect inspection of the halftone type phase shift mask blank.

More specifically, referring to a reflectance which can be used in the defect inspection of the mask blank, since it is necessary to recognize the reflection intensity of a clean mask blank surface (on which a foreign substance is not present), the reflectance of the halftone phase shifter film is 1.5% or more, desirably 2% or more, and more desirably 3% or more. If the reflectance is lower than 1.5%, the clean mask blank surface cannot be recognized at time of calibration. Consequently, a problem occurs in precision in the inspection, for example, the classification or number of the defects and foreign substances is inaccurate or a portion originally having no defect is detected as a false defect. Moreover, it can be supposed that the detection cannot be carried out even if a detection sensitivity is excessively high. Consequently, it is practically desirable that the reflectance should be 50% or less.

It is the most general that an inspecting light having a wavelength of 488 nm should be used in the defect inspection of the mask blank.

Sixth Embodiment

In the example, description will be given to a method of fabricating a mask corresponding to the light exposure of an ArF excimer laser in a halftone phase shift mask according to the invention.

A Ta—Hf film is formed in a thickness of 65 angstrom on a synthetic quartz substrate by using a Ta—Hf alloy target and Ar to be a sputter gas. Next, an SiON film fabricated by regulating a gas flow to have a refractive index of n=2.1 and an attenuation coefficient of k=0.12 at a wavelength of 193 nm is formed in a thickness of 840 angstrom by using an Si target and Ar, $O_2$ and $N_2$ as sputter gases. Thus, a phase shifter film is obtained. FIG. 15 shows the compositions and thicknesses of the TaHf film and the SiON film which are obtained.

Figure 17:
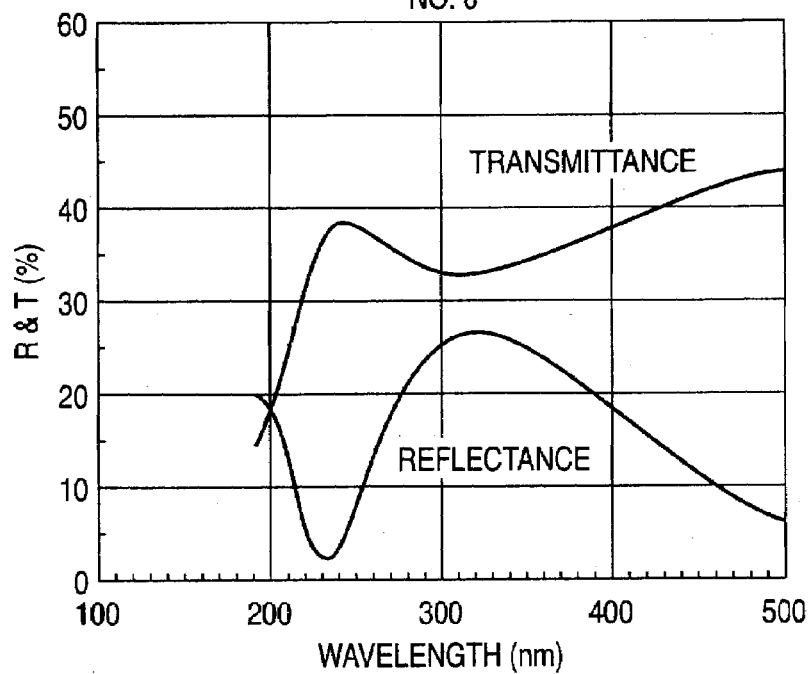
FIG. 17 is a chart showing the transmitting and reflecting spectra of a halftone type phase shift mask blank fabricated in the sixth embodiment.

FIG. 17 shows the transmitting and reflecting spectra of the phase shifter film formed by the film forming method. Moreover, a light transmittance at a wavelength of 193 nm of the ArF excimer laser to be an exposure wavelength, an optical characteristic at an inspection wavelength of a mask of 364 nm, and the value of a reflectance at an inspection wavelength of a blank of 488 nm are shown in FIG. 16.

For a halftone type phase shift mask blank obtained by the example, a defect inspection was carried out by using a mask blanks defect inspecting apparatus M-1320 manufactured by a Laser Tech Co., Ltd. Consequently, the inspection could be performed normally.

As described before in FIGS. 13(a)–13(d), for the next steps, a opaque ring film 9 containing chromium as a principal component and an electron beam drawing resist 10 are sequentially provided on a phase shifter film 5 described above which is constituted by a transmittance adjusting layer 3 comprising Ta—Hf and a phase adjusting layer 4 comprising SiON over a transparent substrate 2 formed by a synthetic quartz substrate (FIG. 13(b)). A pattern is drawn over the resist 10 by an electron beam and developer immersion and baking are then carried out to form a resist pattern 10' (FIG. 13(c)). Subsequently, the opaque ring film 9 is subjected to patterning using the resist pattern 10' as a mask by dry etching with a $Cl_2+O_2$ gas (FIG. 13(d)). Furthermore, the phase shifter film is subjected to the patterning by changing the gas and using the opaque ring film as a mask (FIG. 13(d)). In the example, the etching of the phase adjusting layer 4 was carried out with $CF_4+O_2$, and subsequently, the etching of the transmittance adjusting layer 3 was carried out with a $Cl_2$ gas. The end point of the etching was detected by a reflecting optical system and the end point of each layer was distinguished with the inflection point of a reflected light intensity profile. The sectional shape of the phase shifter film thus patterned was observed. Consequently, a vertical section was observed.

Figure 19:
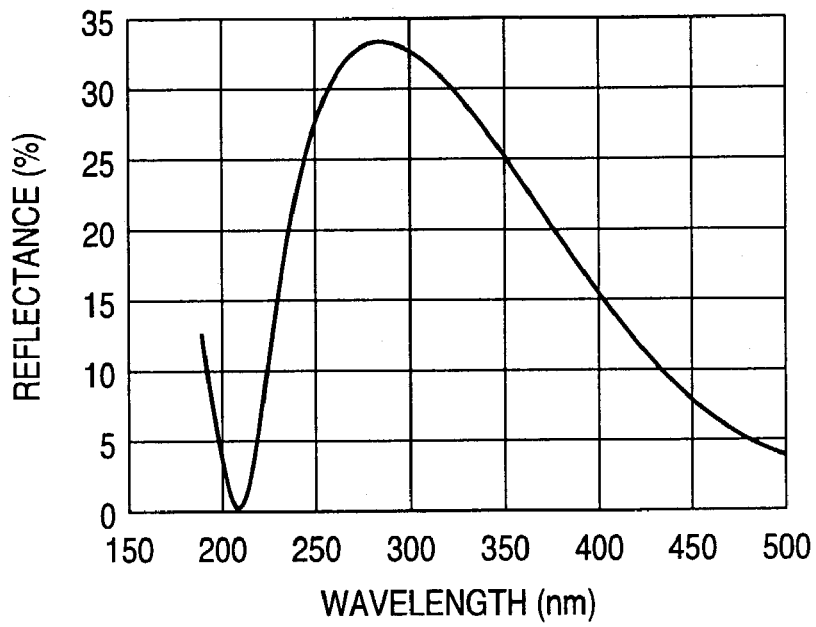
FIG. 19 is a chart showing the reflecting spectrum of a halftone type phase shift mask blank fabricated in the eighth embodiment.
Figure 20:
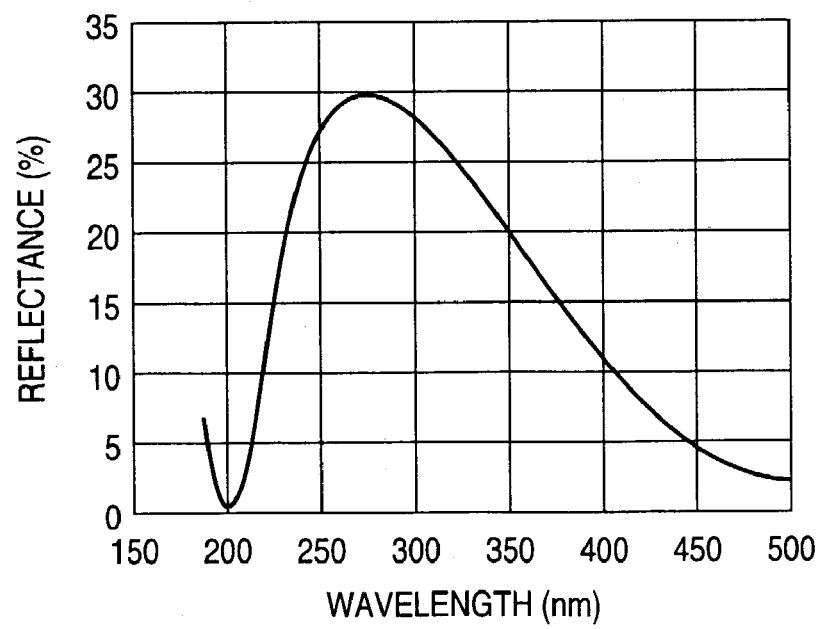
FIG. 20 is a chart showing the reflecting spectrum of a halftone type phase shift mask blank fabricated in the ninth embodiment.
Figure 21:
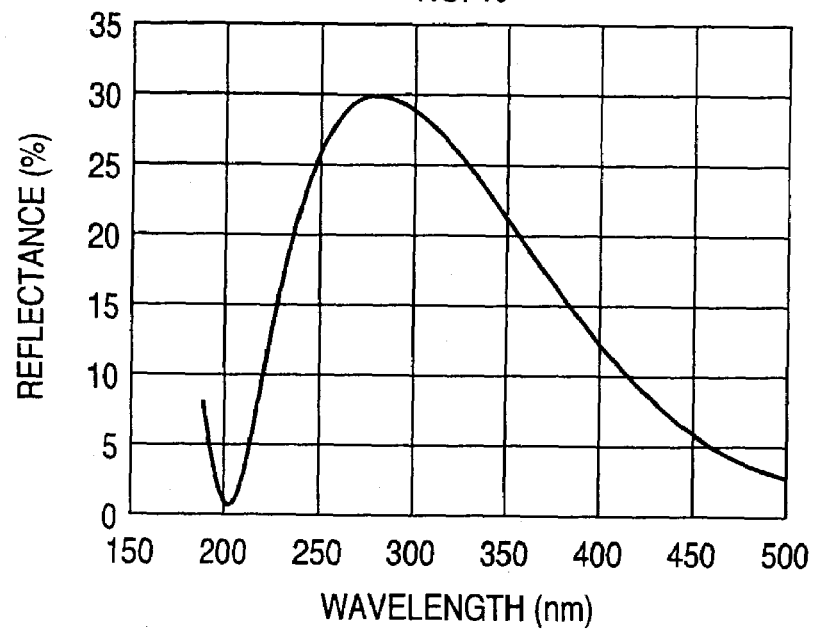
FIG. 21 is a chart showing the reflecting spectrum of a halftone type phase shift mask blank fabricated in the tenth embodiment.
Figure 22:
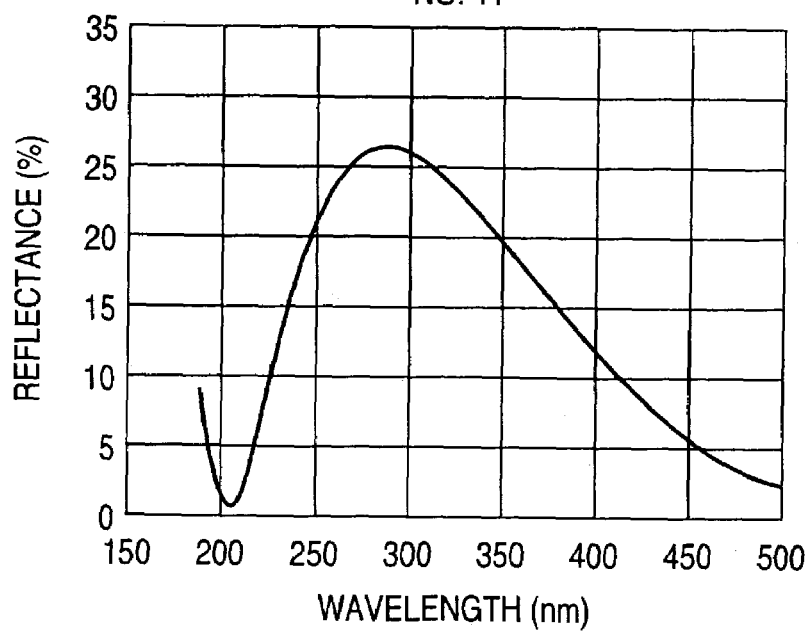
FIG. 22 is a chart showing the reflecting spectrum of a halftone type phase shift mask blank fabricated in the eleventh embodiment.
Figure 23:
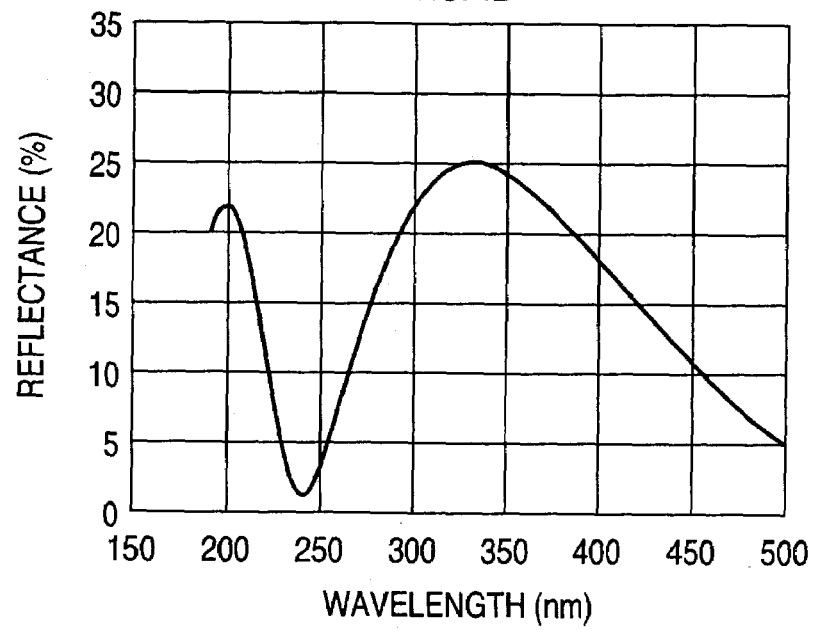
FIG. 23 is a chart showing the reflecting spectrum of a halftone type phase shift mask blank fabricated in the twelfth embodiment.
Figure 24:
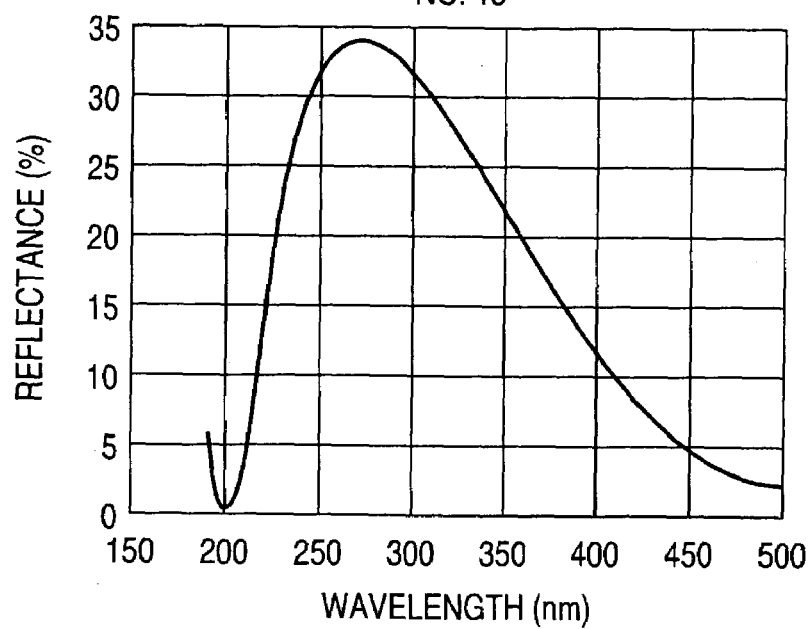
FIG. 24 is a chart showing the reflecting spectrum of a halftone type phase shift mask blank fabricated in the thirteenth embodiment.
Figure 25:
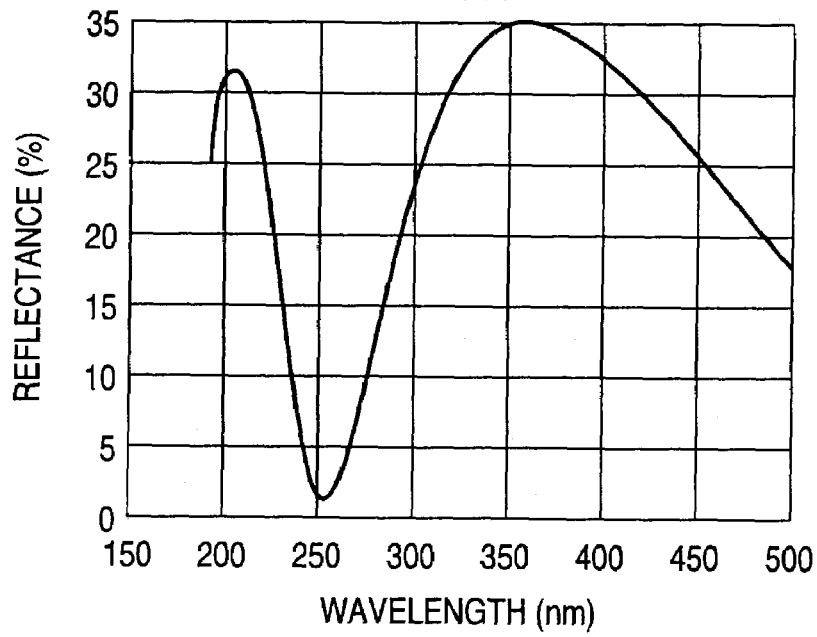
FIG. 25 is a chart showing the reflecting spectrum of a halftone type phase shift mask blank fabricated in the fourteenth embodiment.

Next, the resist provided on the formed pattern is peeled and the resist is applied onto the whole surface again, and a drawing and developing process is then carried out to form a resist pattern (not shown) on the peripheral edge of a mask pattern in such a manner that a opaque layer 9a is formed in a desirable region excluding a opaque ring pattern 9b and the vicinity of a boundary between the halftone phase shifter section 5 and a light transmitting section 7 (see FIG. 19). By wet etching or dry etching, then, Cr provided in portions other than the opaque ring pattern 9b and the opaque layer 9a is removed to obtain the halftone type phase shift mask (see FIG. 9). By using a phase difference meter, a phase difference between the light transmitting section of the mask and the halftone phase shifter section was measured to be 180 degrees at an exposure wavelength.

Referring to the halftone phase shift mask obtained in the example 1, a defect and foreign substance inspection and a pattern appearance inspection (Starlight, Terascan) were carried out at a light source wavelength of 364 nm. As a result of both of the inspections, consequently, there could be obtained a measuring sensitivity and a measuring reproducibility which are excellent.

Seventh Embodiment

In the example, description will be given to a method of fabricating a mask corresponding to the light exposure of an $F_2$ excimer laser in a halftone phase shift mask according to the invention.

A Ta—Hf film is formed in a thickness of 70 angstrom on a synthetic quartz substrate by using a Ta—Hf alloy target and Ar to be a sputter gas. Next, an SiON film fabricated by regulating a gas flow to have a refractive index of n=2.1 and an attenuation coefficient of k=0.25 at a wavelength of 157 nm is formed in a thickness of 780 angstrom by using an Si target and Ar, $O_2$ and $N_2$ as sputter gases. Thus, a phase shifter film is obtained.

Figure 18:
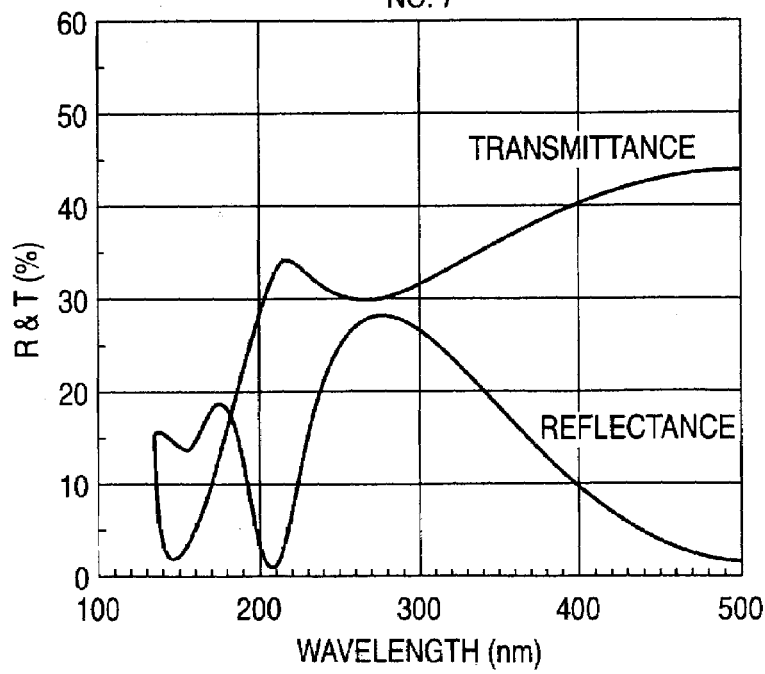
FIG. 18 is a chart showing the transmitting and reflecting spectra of a halftone type phase shift mask blank fabricated in the seventh embodiment.

FIG. 18 shows the transmitting and reflecting spectra of the phase shifter film formed by the film forming method. Moreover, a light transmittance at a wavelength of 157 nm of the $F_2$ excimer laser to be an exposure wavelength, an optical characteristic at an inspection wavelength of a mask of 364 nm, and the value of a reflectance at an inspection wavelength of a blank of 488 nm are shown in FIG. 16.

For a halftone type phase shift mask blank obtained by the example, a defect inspection was carried out by using the same apparatus as that of the sixth embodiment. Consequently, the inspection could be performed normally.

Subsequently, a mask pattern and a opaque ring are formed in the same manner as in the sixth embodiment. Consequently, the halftone phase shift mask is obtained. By using a phase difference meter, a phase difference between the light transmitting section of the mask and the halftone phase shifter section was measured to be 180 degrees at an exposure wavelength.

Referring to the halftone phase shift mask obtained in the seventh embodiment, a defect and foreign substance inspection and a pattern appearance inspection (Starlight, Terascan) were carried out at a light source wavelength of 364 nm. As a result of both of the inspections, consequently, there could be obtained a measuring sensitivity and a measuring reproducibility which are excellent.

Eighth of Fourteenth Embodiments, and Comparative Example

In the eighth to the fourteenth embodiments and the comparative example, description will be given to an example of a halftone phase shift mask blank having a two-layer structure including a TaHf film and an SiON film and having a phase shifter film adjusted by setting an exposure wavelength to an $F_2$ excimer laser (157 nm) or an ArF excimer laser (193 nm), the pattern appearance inspection wavelength of a halftone phase shift mask to 364 nm, the foreign substance inspection wavelength of the halftone phase shift mask to 364 nm, and the defect inspection wavelength of the halftone phase shift mask blank to 488 nm, and a method of fabricating the phase shift mask.

FIGS. 19 to 26 show the transmitting and reflecting spectra of a phase shifter film according to the eighth to the fourteenth embodiments and their comparative example.

In the eighth to the fourteenth embodiments, the halftone type phase shift mask blank having the compositions and thicknesses of the TaHf film and the SiON film shown in FIG. 15 had a reflectance of 2% or more for the wavelength of a light source to be used in the defect inspection of the mask blank as shown in FIG. 16.

Figure 26:
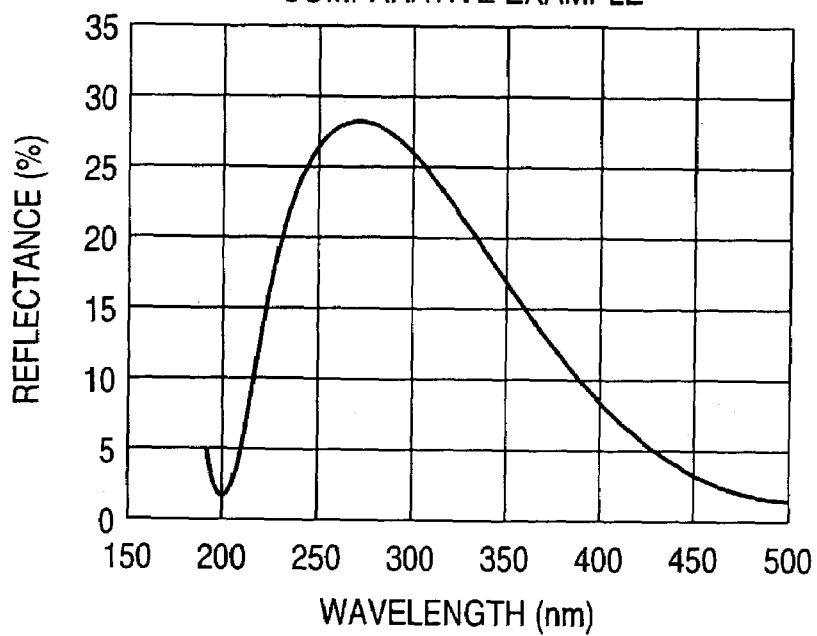
FIG. 26 is a chart showing the reflecting spectrum of a halftone type phase shift mask blank fabricated in a comparative example.
Figure 27:
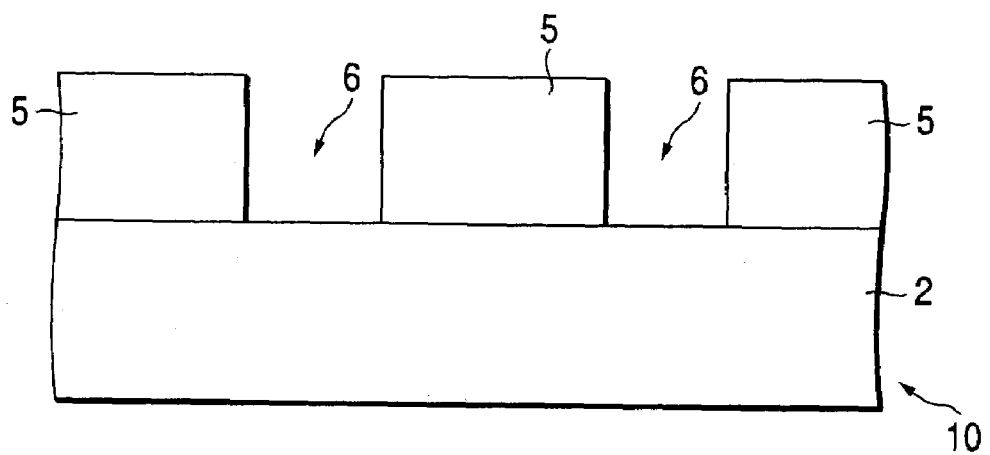
FIG. 27 is a typical view for explaining an embodiment of a halftone type phase shift mask.

In the comparative example, a minimum value in the vicinity of a wavelength of the reflecting spectrum of 500 nm is set in the vicinity of 497 nm as shown in FIG. 26 and reaches a wavelength which is close to an inspection wavelength of 488 nm. On the other hand, in the seventh embodiment, it is apparent that the thickness of an SiON film to be a phase adjusting layer is increased to be 750 angstrom or more so that the minimum value reaches the vicinity of 533 nm, resulting in an increase in a reflectance at the inspection wavelength of 488 nm. In contrast to the comparative example, moreover, it is apparent from a comparison between FIGS. 24 and 26 that a reflecting spectrum tends to be wholly raised in the example 8 in which the thickness of the TaHf film to be a transmittance adjusting layer is increased to be 80 angstrom or more.

Next, the defect inspection was carried out over the halftone type phase shift mask blank obtained in the example by using the same apparatus as that of the sixth embodiment. Consequently, the inspection could be performed normally.

On the other hand, in the comparative example, the reflectance of an inspecting light source in the defect inspection of the mask blank was less than 1.5% so that an error was made at time of calibration before measurement. Consequently, the inspection could not be carried out.

For the halftone phase shift masks, a pattern shape inspection was carried out at a light source wavelength of 364 nm. While the normal inspection could be carried out in the eighth to the fourteenth embodiments, a light reflectance was set beyond a range of 9% to 35% in the fourteenth embodiment. For this reason, a contrast of a light semi-transmitting section to a shielding section could not be taken in an inspection for the appearance of a tritone type halftone phase shift mask. Thus, the inspection could not be carried out.

As described above, according to the invention, it is possible to provide a halftone type phase shift mask and a halftone type phase shift mask blank which reduce a transmittance for an inspecting light by increasing a reflectance with respect to the inspecting light of a multilayer film in a multilayer type halftone phase shift mask corresponding to a reduction in the wavelength of an exposed light (that is, have a predetermined phase angle and transmittance with respect to the wavelength of the exposed light having a reduced wavelength) or corresponding to an increase in the transmittance of the exposed light of the halftone phase shifter section, there by reducing the transmittance for the inspecting light.

Moreover, it is possible to provide a halftone type phase shift mask and a halftone type phase shift mask blank which can be applied to an inspecting technique utilizing a reflected light corresponding to a reduction in the wavelength of an exposed light or an increase in the transmittance of the exposed light of the halftone phase shifter section.

Furthermore, it is possible to provide a halftone type phase shift mask and a halftone type phase shift mask blank which can inspect a pattern appearance with higher precision at the wavelength of an inspecting light in a high transmittance product (a transmittance of 8 to 30%) in an exposed light wavelength region of 140 nm to 200 nm, particularly, in the vicinity of 157 nm to be the wavelength of an $F_2$ excimer laser and the vicinity of 193 nm to be the wavelength of an ArF excimer laser.

Further, according to the invention, it is possible to obtain a halftone phase shift mask blank and a halftone type phase shift mask which correspond to two different inspection wavelengths and can obtain sufficient precision in an inspection at both of the inspection wavelengths in the inspection using a reflection.

According to the invention, moreover, it is possible to obtain a halftone phase shift mask blank and a halftone type phase shift mask in which sufficient precision in an inspection can be acquired by using the light sources of inspecting apparatus for both an i-ray wavelength and a DUV region.

Further, according to the invention, it is possible to provide a halftone type phase shift mask blank in which a predetermined transmittance and phase shift amount is adjusted for an exposed light having a wavelength selected from a wavelength of 140 nm to 200 nm, a defect inspection for the halftone type phase shift mask blank can be carried out and a defect can be guaranteed as the mask blank, a halftone type phase shift mask manufactured by using the halftone type phase shift mask blank, and a method of manufacturing the halftone type phase shift mask blank.

What is claimed is:

1. A halftone type phase shift mask blank for manufacturing a halftone type phase shift mask which is inspected by an inspection light and is exposed by an exposure light, which blank includes, on a transparent substrate, at least a phase shifter film having, for the exposure light, a predetermined transmittance and a predetermined phase difference with respect to the transparent substrate, wherein the phase shifter film comprises a multilayer film including at least an upper layer and a lower layer below said upper layer, a refractive index of the upper layer at a wavelength of the inspection light being smaller than that of the lower layer, said phase shifter film having a surface reflectance spectra of which a peak is at a vicinity of said wavelength of the inspecting light.

2. The halftone type phase shift mask blank of claim 1 wherein the upper layer having a thickness d so that the following condition is satisfied:

$$0.8 \times \lambda'/(2n') \leq d \leq 1.2 \times \lambda'/(2n'),$$

in which λ' represents a wavelength of the inspection light and n' represents a refractive index of the upper layer for the wavelength λ'.

3. The halftone type phase shift mask blank of claim 2, wherein said phase shifter film has a surface reflectance within a range of 10 to 40% and a transmittance of 60% or less for the inspection light.

4. The halftone type phase shift mask blank of claim 3, wherein the inspection light has a wavelength which is 250 nm or longer.

5. The halftone type phase shift mask blank of claim 4, wherein the inspection light has a wavelength which is in a range of 250 nm to 400 nm.

6. The halftone type phase shift mask blank of claim 2, wherein the exposure light has a wavelength which is between 140 to 200 nm.

7. The halftone type phase shift mask blank of claim 6, wherein the transmittance of the exposure light of the shifter film is between 3 to 40%.

8. The halftone type phase shift mask blank of claim 7, wherein the transmittance of the exposure light of the shifter film is between 8 to 30%.

9. The halftone type phase shift mask blank of claim 8, wherein the upper layer is a phase adjusting layer having a function of primarily shifting the phase of the exposure light, and the lower layer is a transmittance adjusting layer having a function of primarily reducing the transmittance of the phase shifter film.

10. The halftone type phase shift mask blank according to claim 9, wherein the thickness d of the upper layer satisfies the following condition:

$$0.44 \times \lambda/(n-1) \leq d \leq 0.56 \times \lambda/(n-1),$$

where λ represents a wavelength of an exposure light and n represents a refractive index of the upper layer at wavelength λ.

11. The halftone type phase shift mask blank of claim 2, wherein the upper layer comprises at least one of SiOx, SiOxNy, or one of which added with a metal selected from a group consisting of Mo, Ta, W, Zr, Cr, and Hf.

12. The halftone type phase shift mask blank of claim 1, wherein the inspection light reflected on the upper layer and that reflected on the lower layer causes interference to make the surface reflection spectra of the phase shifting film.

13. A halftone type phase shift mask blank for manufacturing a halftone type phase shift mask which is inspected by an inspection light and is exposed by an exposure light, which blank comprises, on a transparent substrate, at least a phase shifter film having, for the exposure light, a predetermined transmittance and a predetermined phase difference with respect to the transparent substrate, wherein the phase shifter film comprises a multilayer film including at least an upper layer and a lower layer below said upper layer, a refractive index of the upper layer at a wavelength of the inspection light being smaller than that of the lower layer, and the upper layer having a thickness d so that the following condition is satisfied:

$$0.8 \times \lambda'/(2n') \leq d \leq 1.2 \times \lambda'/(2n'),$$

in which λ' represents a wavelength of the inspection light and n' represents a refractive index of the upper layer for the wavelength λ'.

14. The halftone type phase shift mask blank of claim 13, wherein the inspection light has a wavelength which is 250 nm or longer.

15. The halftone type phase shift mask blank of claim 14, wherein the exposure light has a wavelength which is between 140 to 200 nm.

16. The halftone type phase shift mask blank of claim 15, wherein said phase shifter film having a surface reflectance within a range of 10 to 40% and a transmittance of 60% or less for the inspection light.

17. The halftone type phase shift mask blank of claim 16, wherein the inspection light reflected on the upper layer and that reflected on the lower layer causes interference to make the surface reflection spectra of the phase shifting film.

18. The halftone type phase shift mask blank of claim 17, wherein the phase shifter film is a two-layer film in which a phase of the exposure light is converted by approximately 180 degrees and a transmittance for the exposed light is from 3 to 40%, the upper layer is a phase adjusting layer having a function of primarily shifting the phase for the exposure light, and the lower layer is a transmittance adjusting layer having a function of primarily reducing the transmittance of the phase shift film.

19. The halftone type phase shift mask blank according to claim 18, wherein the thickness d of the upper layer satisfies the following condition:

$$0.44 \times \lambda/(n-1) \leq d \leq 0.56 \times \lambda/(n-1),$$

where λ represents a wavelength of an exposure light and n represents a refractive index of the upper layer at wavelength λ.

20. A halftone type phase shift mask blank to be used for manufacturing a halftone type phase shift mask in which a light transmitting section for transmitting an exposure light and a phase shifter section for transmitting a part of the exposure light and shifting a phase of the transmitted light by a predetermined amount at the same time are provided on a transparent substrate, and an optical characteristic is designed in such a manner that the lights transmitted in the vicinity of a boundary portion between the light transmitting section and the phase shifter section are cancelled by each other, and a contrast of an exposed light pattern at the boundary portion to be transferred onto a surface of an exposed member can be thereby improved, said blank having a phase shifter film for forming the phase shifter section on the transparent substrate, said halftone phase shift mask being subjected to inspection by an inspection light, wherein the phase shifter film comprises a multilayer film including at least an upper layer and a lower layer below said upper layer, a refractive index of the upper layer at a wavelength of the inspection light being smaller than that of the lower layer, and a surface reflectance of the said phase shifter film is from 5 to 40% for at least two different inspection wavelengths.

21. The halftone type phase shift mask blank according to claim 20, wherein the exposure light of said halftone type phase shift mask has a wavelength within a range of 140 nm to 200 nm and said at least two inspection wavelengths are within a range of 240 nm to 370 nm.

22. The halftone type phase shift mask blank according to claim 21, wherein the thickness of the upper layer is such that the surface reflectance spectra of the phase shifter film has a peak at a wavelength within a range of 220 nm to 340 nm.

23. The halftone type phase shift mask blank according to claim 22, wherein the exposure light is $F_2$ excimer laser.

24. The halftone type phase shift mask blank according to claim 22, wherein the exposure light is ArF excimer laser and the phase shifter film has a transmittance of 8 to 30% for said exposure light.

25. The halftone type phase shift mask blank according to claim 22, wherein the thickness d of the upper layer satisfies the following condition:

$$0.44 \times \lambda/(n-1) \leq d \leq 0.56 \times \lambda/(n-1),$$

where λ represents a wavelength of an exposure light and n represents a refractive index of the upper layer at wavelength λ.

26. A halftone type phase shift mask blank to be used for manufacturing a halftone type phase shift mask in which a light transmitting section for transmitting an exposure light and a phase shifter section for transmitting a part of the exposure light and shifting a phase of the transmitted light by a predetermined amount at the same time are provided on a transparent substrate, the halftone type phase shift mask having an optical characteristic such that lights transmitted in the vicinity of a boundary portion between the light transmitting section and the phase shifter section are canceled by each other, and a contrast of an exposed light pattern at boundary portion to be transferred onto a surface of an exposed member can be thereby improved, which phase shift mask blank having a phase shifter film for forming the phase shifter section on the transparent substrate, said phase shift mask blank being subjected to blank inspection by a first inspection light, wherein the phase shifter film comprises a multilayer film including at least an upper layer and a lower layer below said upper layer, the upper layer being a phase adjusting layer having a function of primarily shifting the phase of the exposure light, and the lower layer is a transmittance adjusting layer having a function of primarily reducing the transmittance of the phase shifter film, said phase shifter film having a predetermined transmittance and phase shift amount for a wavelength from 140 nm to 200 nm of an exposure light of the phase shift mask, and a reflectance of 1.5% or more with respect to the first inspection light of the blank inspection.

27. The halftone type phase shift mask blank according to claim 26, wherein a wavelength of the first inspection light is that being suitable for inspecting a defect due to foreign substance.

28. The halftone type phase shift mask blank according to claim 27, wherein a wavelength of the first inspection light is 488 nm.

29. The halftone type phase shift mask blank according to claim 28, said halftone phase shift mask being subjected to a mask inspection by a second inspection light, a wavelength of the second inspection light being within, a range of 240 to 370 nm, wherein the phase shifter film has a reflectance to the second inspection light of at least 9%.

30. The halftone type phase shift mask blank according to claim 29, wherein the phase shifter film has a reflectance to the second inspection light of 9 to 35%.

31. The halftone type phase shift mask blank according to claim 30, wherein the thickness of the upper layer is such that the minimum value of the reflection spectra of the phase shifter film is not within the range of 200 to 500 nm.

32. The halftone type phase shift mask blank according to claim 31, wherein the thickness of the upper layer is at least 750 angstrom.

33. The halftone type phase shift mask blank according to claim 31, wherein the thickness of the lower layer is at least 80 angstrom.

34. The halftone type phase shift mask blank according to claim 31, wherein the phase shifter film is a two-layer film in which a phase of the exposure light for the phase shift mask is converted by approximately 180 degrees and a transmittance for the exposed light is from 3 to 40%.

35. The halftone type phase shift mask blank according to claim 31, wherein the thickness d of the upper layer satisfies the following condition:

$$0.44 \times \lambda/(n-1) \leq d \leq 0.56 \times \lambda/(n-1),$$

where λ represents a wavelength of an exposure light and n represents a refractive index of the upper layer at wavelength λ.

36. A halftone type phase shift mask which is inspected by an inspection light and is exposed by an exposure light, which mask comprises, on a transparent substrate, at least a phase shifter film having, for the exposure light, a predetermined transmittance and a predetermined phase difference with respect to the transparent substrate, wherein the phase shifter film comprises a multilayer film including at least an upper layer and a lower layer below said upper layer, a refractive index of the upper layer at a wavelength of the inspection light being smaller than that of the lower layer, and the upper layer having a thickness d so that the following condition is satisfied:

$$0.8 \times \lambda'/(2n') \leq d \leq 1.2 \times \lambda'/(2n'),$$

in which λ' represents a wavelength of the inspection light and n' represents a refractive index of the upper layer for the wavelength λ'.

37. The halftone type phase shift mask of claim 36, wherein said phase shifter film having a surface reflectance for the inspection light within a range of 10 to 40% and a transmittance of 60% or less.

38. The halftone type phase shift mask of claim 37, wherein the inspection light has a wavelength which is 250 nm or longer.

39. The halftone type phase shift mask of claim 38, wherein the inspection light has a wavelength which is in a range of 250 nm to 400 nm.

40. The halftone type phase shift mask of claim 39, wherein the inspection light reflected on the upper layer and that reflected on the lower layer causes interference to make the surface reflection spectra of the phase shifting film.

41. The halftone type phase shift mask of claim 39, wherein the exposure light has a wavelength which is between 140 to 200 nm.

42. The halftone type phase shift mask of claim 41, wherein the transmittance of the exposure light of the shifter film is between 3 to 40%.

43. The halftone type phase shift mask of claim 42, wherein the transmittance of the exposure light of the shifter film is between 8 to 30%.

44. The halftone type phase shift mask of claim 43, wherein the upper layer is a phase adjusting layer having a function of primarily shifting the phase of the exposure light, and the lower layer is a transmittance adjusting layer having a function of primarily reducing the transmittance of the phase shifter film.

45. The halftone type phase shift mask according to claim 44, wherein the thickness d of the upper layer satisfies the following condition:

0.44×λ/(n−1)≦d≦0.56×λ/(n−1), where λ represents a wavelength of an exposure light and n represents a refractive index of the upper layer at wavelength λ.

46. The halftone type phase shift mask of claim 45, wherein the upper layer comprises at least one of SiOx, SiOxNy, or one of which added with a metal selected from a group consisting of Mo, Ta, W, Zr, Cr, and Hf.

47. The halftone type phase shift mask according to claim 46, wherein said halftone type phase shift mask being prepared by forming a light transmitting section and a halftone phase shifter section by patterning the phase shifter film on a halftone type phase shift mask blank.

48. The halftone type phase shift mask according to claim 47, wherein an opaque layer is further formed on the phase shifter film in a region excluding the vicinity of a boundary between the halftone phase shifter section and the light transmitting section.

49. A method of manufacturing the halftone type phase shift mask, the method comprising:
transferring a pattern onto a halftone type mask blank to make a halftone type mask, which mask blank comprises, on a transparent substrate, at least a phase shifter film having a predetermined transmittance for an exposure light and a predetermined phase difference with respect with the transparent substrate, said phase shifter film comprising multilayer-film including at least an upper layer and a lower layer below said upper layer, and a refractive index of the upper layer at a wavelength of an inspection light is smaller than that of the lower layer, and
carrying out an inspection of the halftone type mask by the inspection light having a wavelength of at least 250 nm,
wherein the upper layer having a thickness d so that the following condition is satisfied:

0.8×λ'/(2n')≦d≦1.2×λ'/(2n), in which λ' represents a wavelength of the inspection light and n' represents a refractive index of the upper layer for the wavelength λ'.

50. The method of claim 49, wherein the phase shifter film has a surface reflectance for the inspection light within a range of 10 to 40% and a transmittance of 60% or less for the inspection light.

51. The method of claim 50, wherein the inspection light has a wavelength which is 250 nm to 400 nm.

52. The method of claim 51, wherein the inspection light reflected on the upper layer and that reflected on the lower layer generates interference each other to make a peak of surface reflectance spectra.

53. The method of claim 52, wherein the exposure light has a wavelength which is between 140 to 200 nm.

54. The method of claim 53, wherein the predetermined transmittance is between 8 to 30%.

55. A method of manufacturing the halftone type phase shift mask, the method comprising:
transferring a pattern onto a halftone type mask blank to make a halftone type mask, which mask blank comprises, on a transparent substrate, at least a phase shifter film having a predetermined transmittance for an exposure light and a predetermined phase difference with respect with the transparent substrate, said phase shifter film comprising multilayer film including at least an upper layer and a lower layer below said upper layer, and a refractive index of the upper layer at a wavelength of an inspection light is smaller than that of the lower layer, and
carrying out an inspection of the halftone type mask by the inspection light of at least two different inspection wavelengths in conditions in that the a surface reflectance of the said phase shifter film is from 5 to 40% for the two different inspection wavelengths.

56. A method of manufacturing the halftone type phase shift mask blank, which blank being for manufacturing a halftone type phase shift mask in which a light transmitting section for transmitting an exposed light and a phase shifter section for transmitting a part of the exposed light and shifting a phase of the transmitted light by a predetermined amount at the same time are provided on a transparent substrate, the halftone type phase shift mask blank having an optical characteristic such that lights transmitted in the vicinity of a boundary portion between the light transmitting section and the phase shifter section are canceled by each other, and a contrast of an exposed light pattern boundary portion to be transferred onto a surface of an exposed member can be thereby held, and having a phase shifter film for forming the phase shifter section on the transparent substrate, said method comprising:
providing, on a transparent substrate, at least a phase shifter film having a predetermined transmittance and a predetermined phase difference with respect with the transparent substrate for an exposure light for the mask, said phase shifter film comprising multilayer film including at least an upper layer and a lower layer below said upper layer, and a refractive index of the upper layer at a wavelength of an inspection light is smaller than that of the lower layer, said phase shifter film having a predetermined transmittance and phase shift amount of 180 degrees at a wavelength from 140 nm to 200 nm of an exposure light, and
carrying out a blank inspection by an inspection light having wavelength of 488 nm in a condition that a reflectance of the phase shifter film is 1.5% or more with respect to the inspection light.

* * * * *